United States Patent
Choi et al.

(10) Patent No.: US 7,927,950 B2
(45) Date of Patent: Apr. 19, 2011

(54) METHOD OF FABRICATING TRAP TYPE NONVOLATILE MEMORY DEVICE

(75) Inventors: Han-Mei Choi, Seoul (KR);
Chang-Hyun Lee, Gyeonggi-do (KR);
Seung-Hwan Lee, Suwon-si (KR);
Young-Geun Park, Gyeonggi-do (KR);
Sung-Jung Kim, Gyeonggi-do (KR);
Young-Sun Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 166 days.

(21) Appl. No.: 11/672,916

(22) Filed: Feb. 8, 2007

(65) Prior Publication Data

US 2007/0134868 A1    Jun. 14, 2007

Related U.S. Application Data

(63) Continuation-in-part of application No. 11/459,599, filed on Jul. 24, 2006, now abandoned.

(30) Foreign Application Priority Data

Sep. 1, 2005    (KR) .................. 10-2005-0081350

(51) Int. Cl.
*H01L 21/336*    (2006.01)
(52) U.S. Cl. ................. 438/258; 438/316; 257/E21.683
(58) Field of Classification Search ............ 438/316, 438/258, 324; 257/324
See application file for complete search history.

(56) References Cited

U.S. PATENT DOCUMENTS

| | | | |
|---|---|---|---|
| 3,635,774 A | 1/1972 | Ohta | |
| 4,291,326 A | 9/1981 | Higuchi et al. | |
| 5,087,584 A | 2/1992 | Wada et al. | |
| 5,104,819 A | 4/1992 | Freiberger et al. | |
| 5,235,187 A | 8/1993 | Arney et al. | |
| 5,366,590 A | 11/1994 | Kadomura | |
| 5,449,640 A | 9/1995 | Hunt et al. | |
| 5,599,741 A * | 2/1997 | Matsumoto et al. | 438/304 |
| 5,672,539 A | 9/1997 | Thakur et al. | |
| 5,723,355 A * | 3/1998 | Chang et al. | 438/275 |
| 5,856,221 A | 1/1999 | Clementi et al. | |
| 5,885,903 A | 3/1999 | Torek et al. | |
| 5,898,258 A | 4/1999 | Sakai et al. | |
| 6,117,730 A | 9/2000 | Komori et al. | |
| 6,146,948 A * | 11/2000 | Wu et al. | 438/275 |
| 6,204,203 B1 * | 3/2001 | Narwankar et al. | 438/785 |
| 6,465,306 B1 | 10/2002 | Ramsbey et al. | |
| 6,642,573 B1 | 11/2003 | Halliyal et al. | |
| 6,649,538 B1 * | 11/2003 | Cheng et al. | 438/775 |

(Continued)

FOREIGN PATENT DOCUMENTS

JP    2000-114500    4/2000

(Continued)

*Primary Examiner* — Phat X Cao
*Assistant Examiner* — Nga Doan
(74) *Attorney, Agent, or Firm* — Myers Bigel Sibley & Sajovec, P.A.

(57) ABSTRACT

A method of fabricating a floating trap type nonvolatile memory device includes forming a cell gate insulating layer on a semiconductor substrate, the cell gate insulating layer being comprised of a lower insulating layer, a charge storage layer and an upper insulating layer sequentially stacked; thermally annealing the cell gate insulating Layer at a temperature of approximately 810° C. to approximately 1370° C.; and forming a gate electrode on the thermally annealed cell gate insulating layer.

34 Claims, 34 Drawing Sheets

U.S. PATENT DOCUMENTS

| | | |
|---|---|---|
| 6,656,808 B2 | 12/2003 | Kwean |
| 6,821,835 B2 * | 11/2004 | Wilk .......................... 438/216 |
| 6,849,505 B2 * | 2/2005 | Lee et al. ..................... 438/261 |
| 6,867,453 B2 * | 3/2005 | Shin et al. .................... 257/314 |
| 6,900,098 B1 | 5/2005 | Ogura et al. |
| 7,141,483 B2 * | 11/2006 | Yuan et al. .................. 438/407 |
| 2002/0115252 A1 * | 8/2002 | Haukka et al. ............... 438/240 |
| 2002/0197800 A1 * | 12/2002 | Hashimoto et al. ........... 438/266 |
| 2003/0062567 A1 * | 4/2003 | Zheng et al. ................. 257/316 |
| 2003/0096472 A1 | 5/2003 | Kang et al. |

FOREIGN PATENT DOCUMENTS

| | | |
|---|---|---|
| JP | 2004-311803 | 11/2004 |
| KR | 10-1998-0043614 | 9/1998 |
| KR | 10-1998-0047615 | 9/1998 |
| KR | 100193892 B1 | 2/1999 |
| KR | 10-2004-0093606 | 11/2004 |
| KR | 10-2004-0106074 | 12/2004 |
| KR | 10-2004-0108309 | 12/2004 |

* cited by examiner

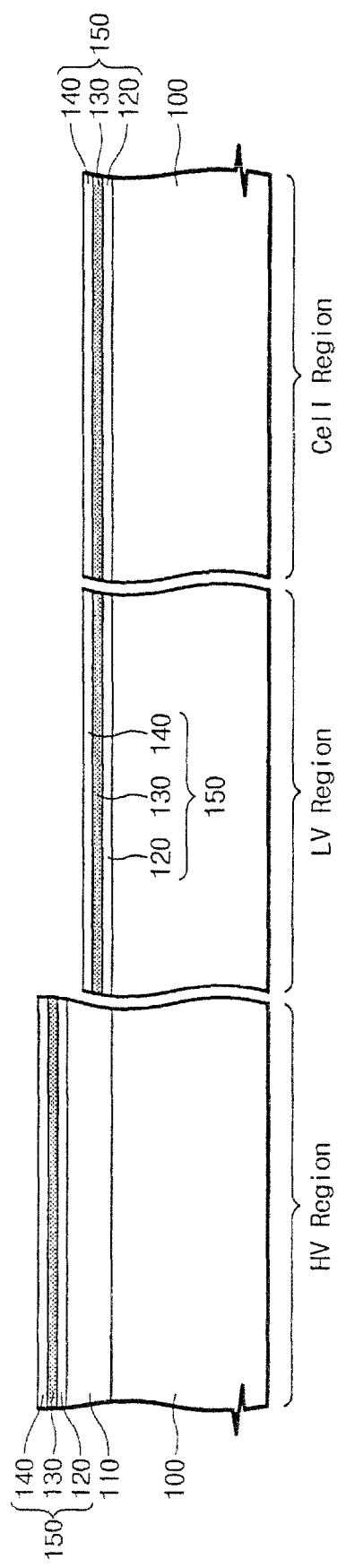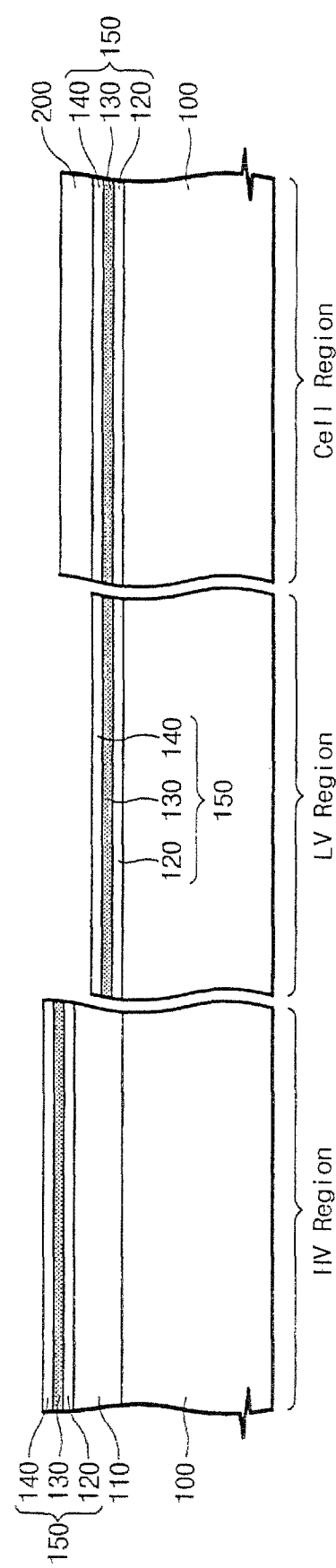

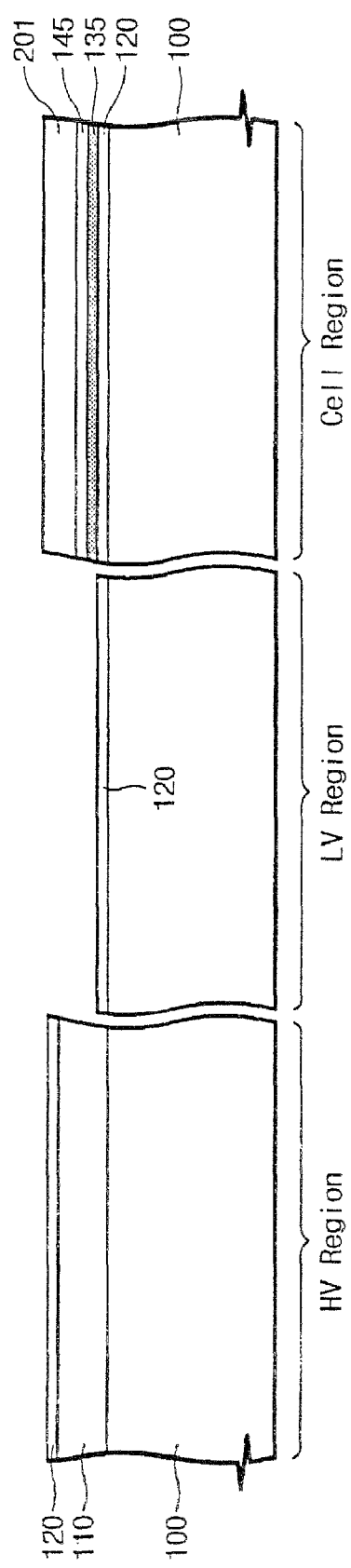

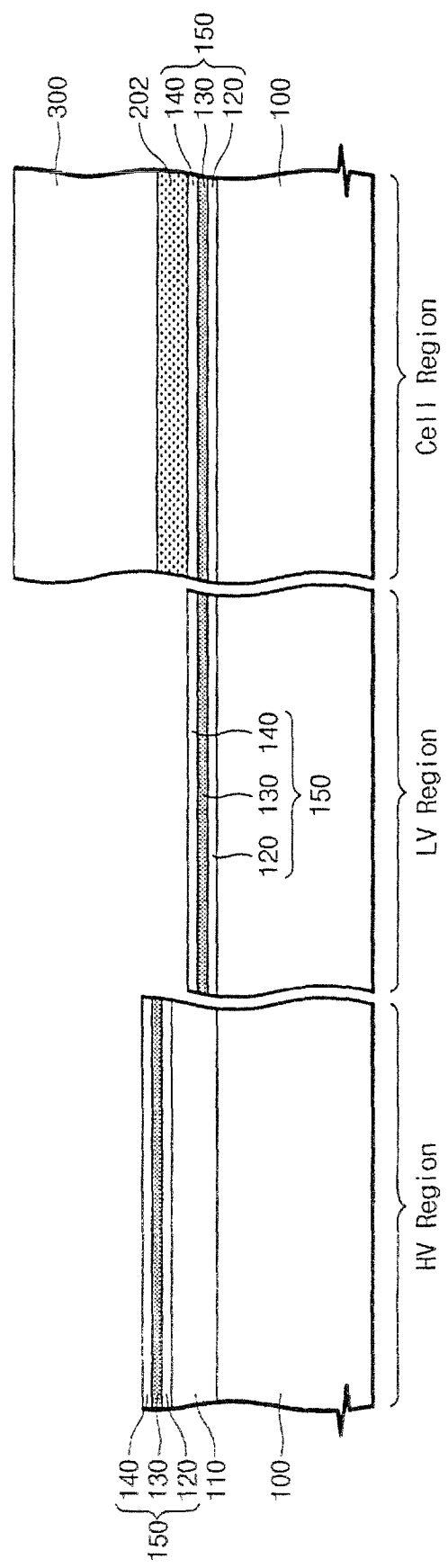

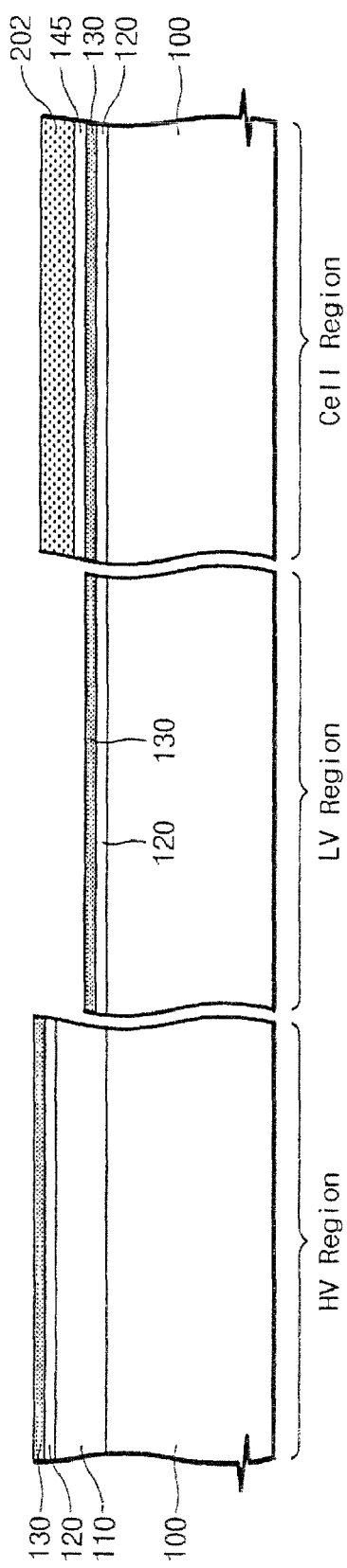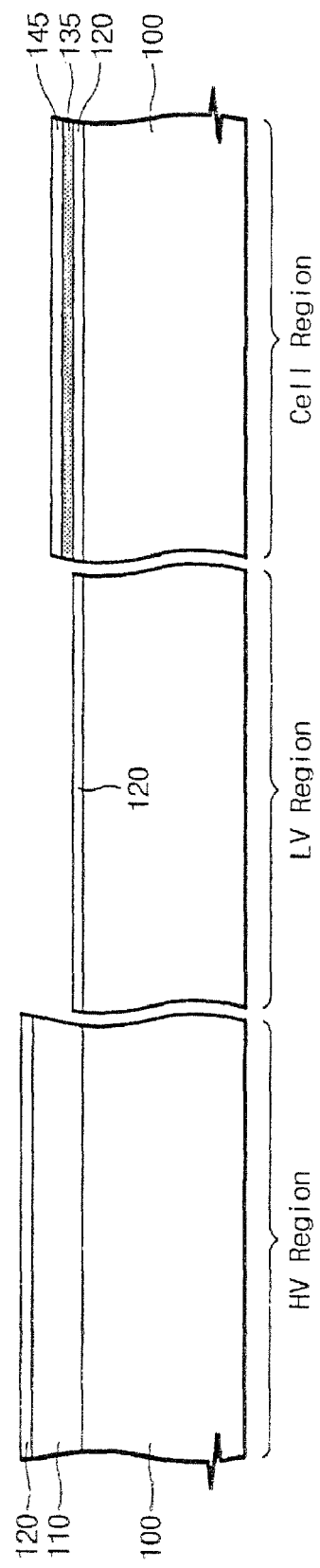

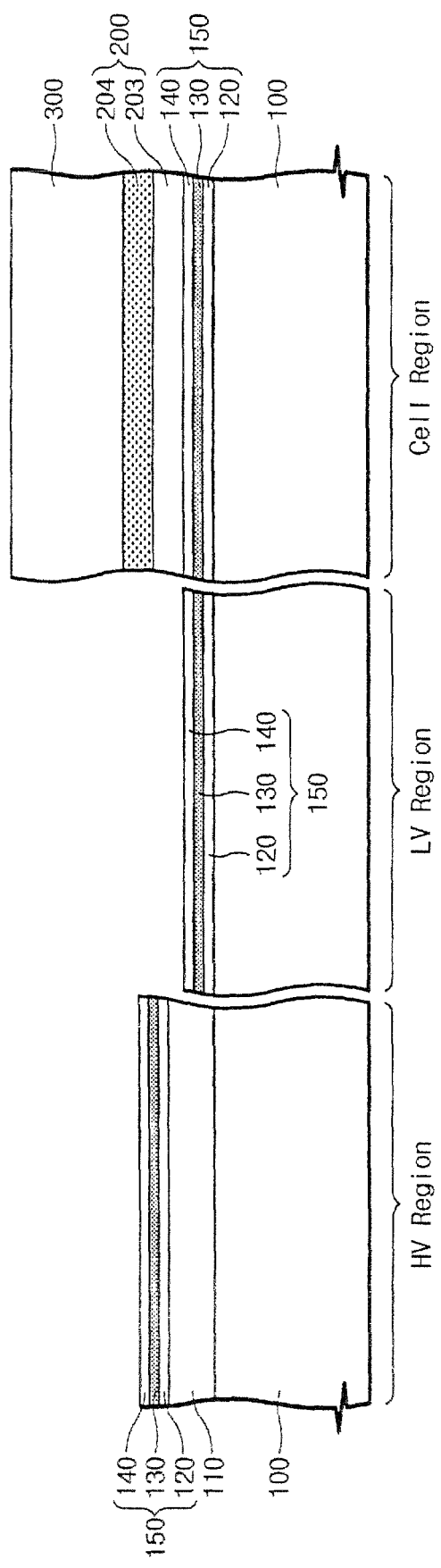

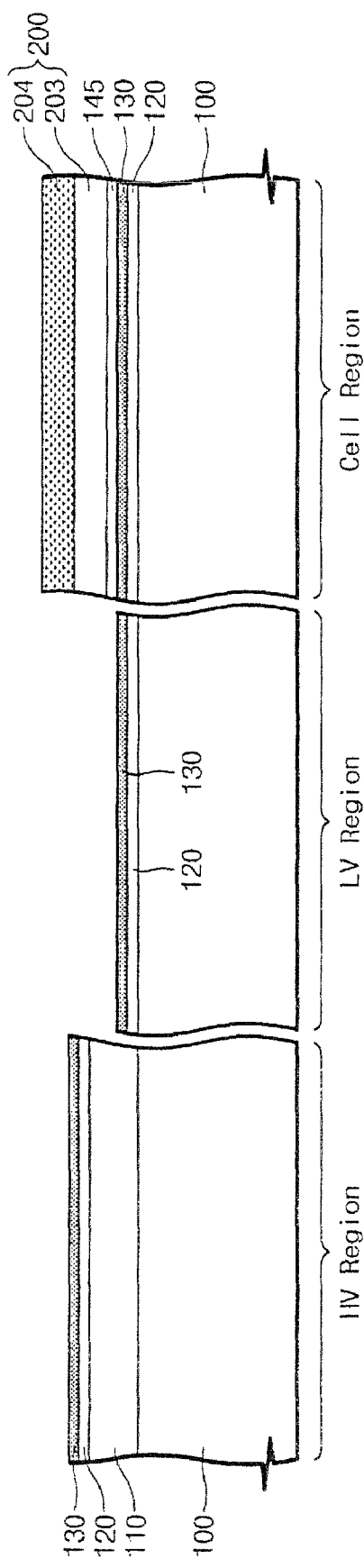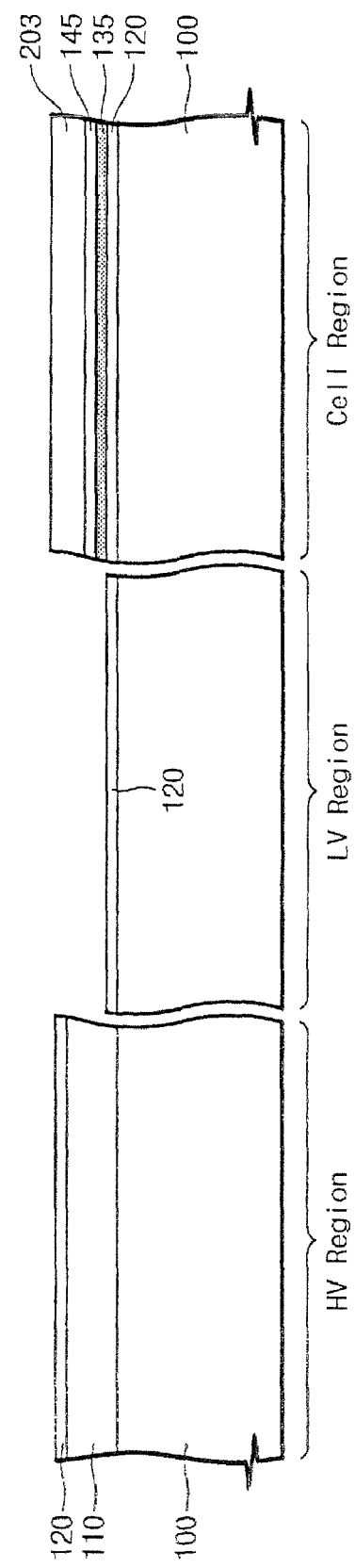

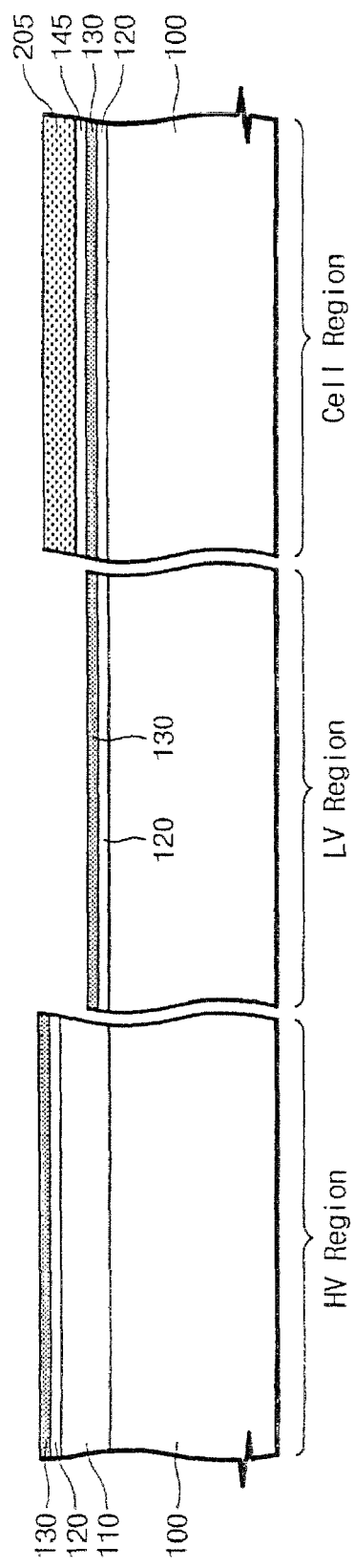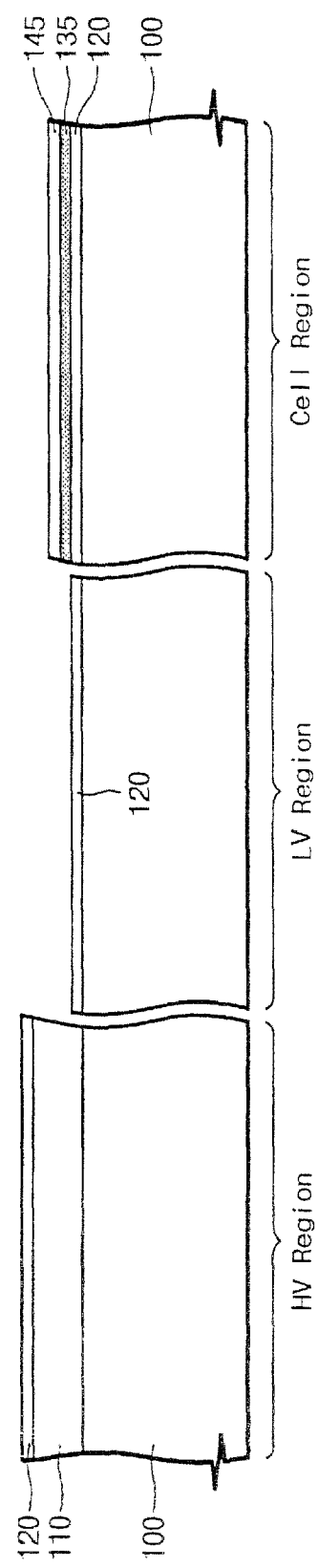

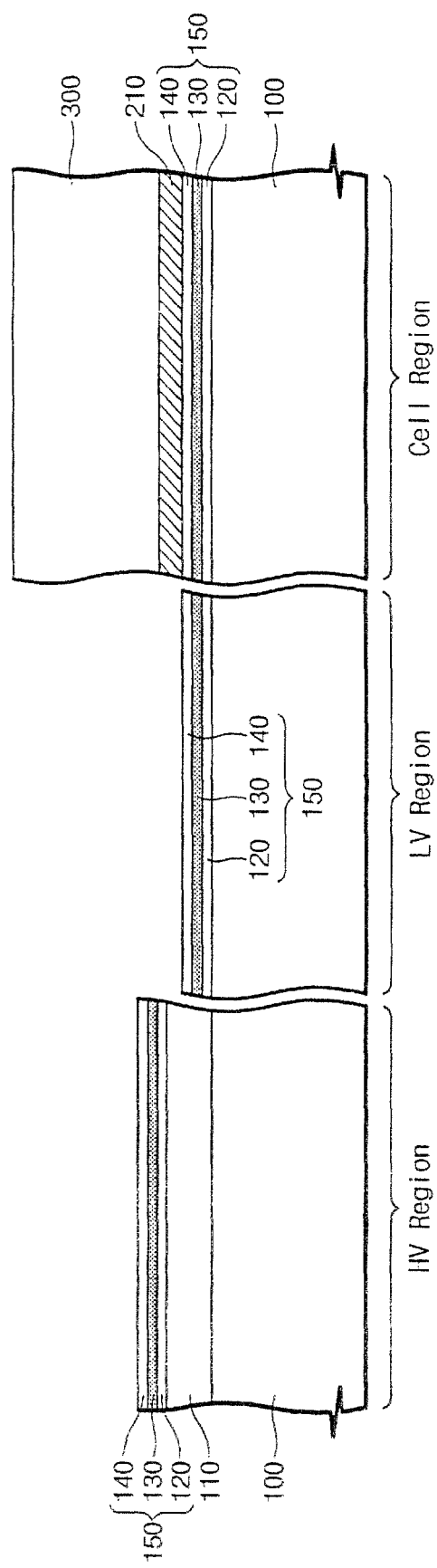

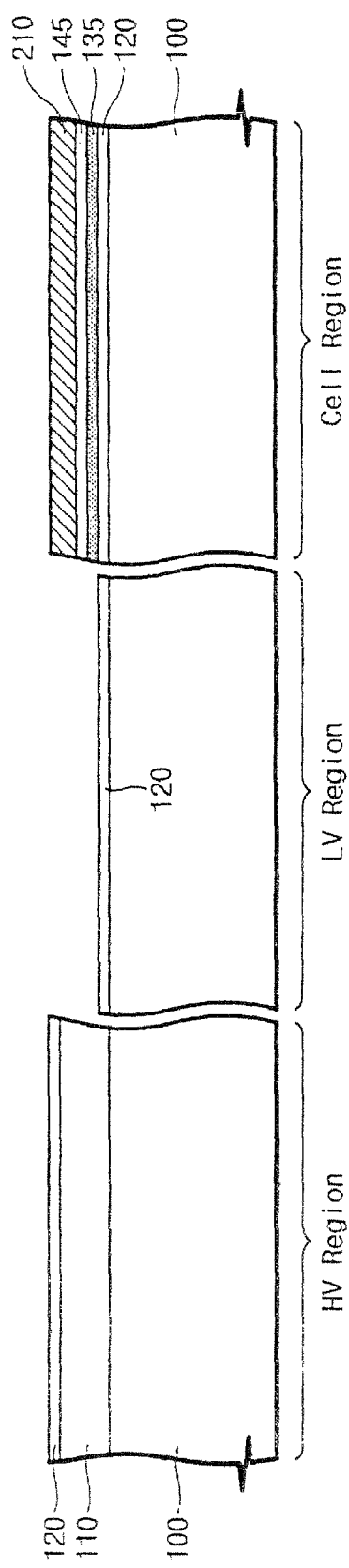
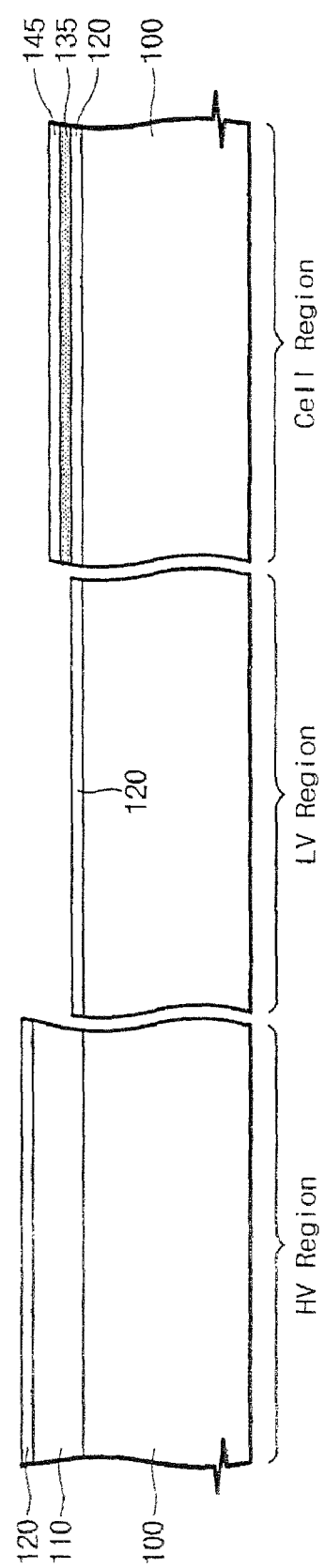

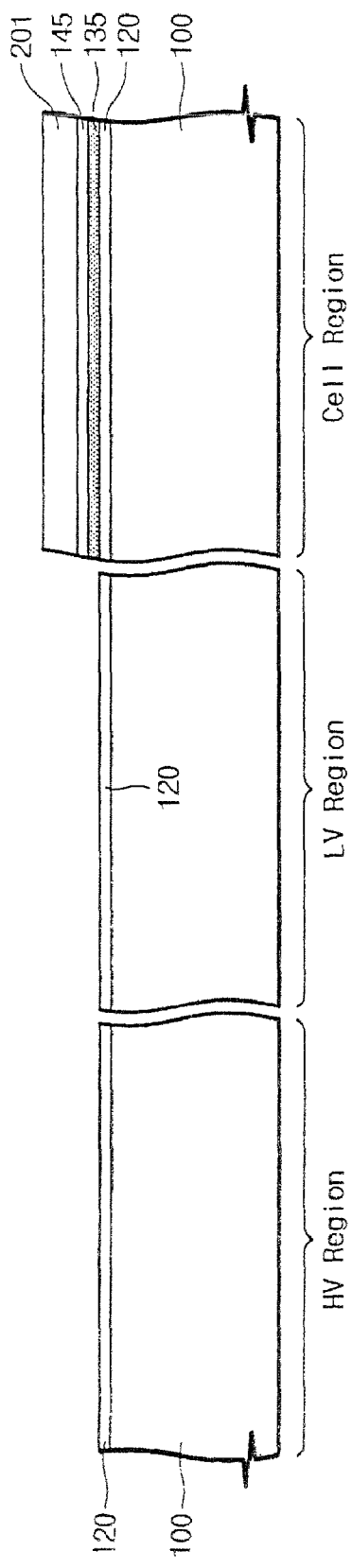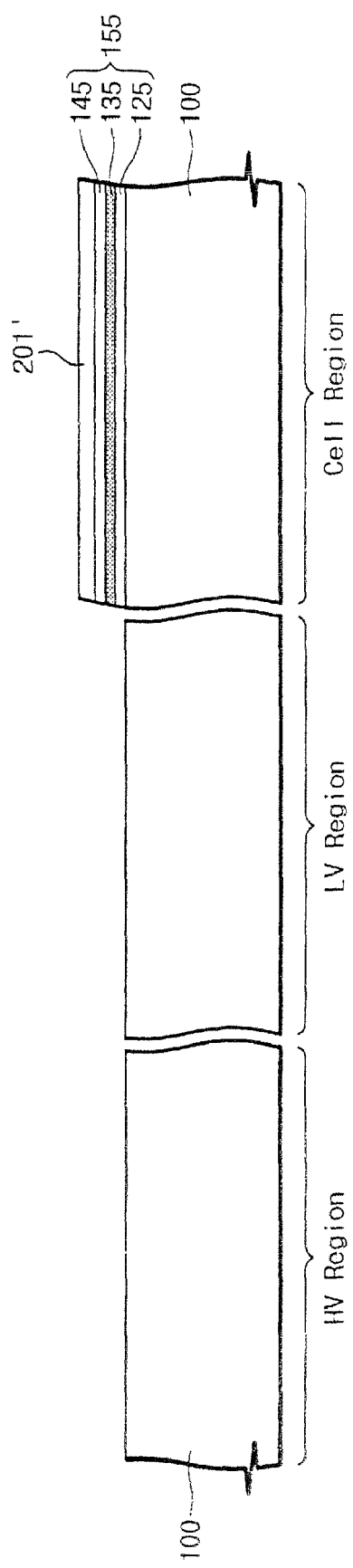

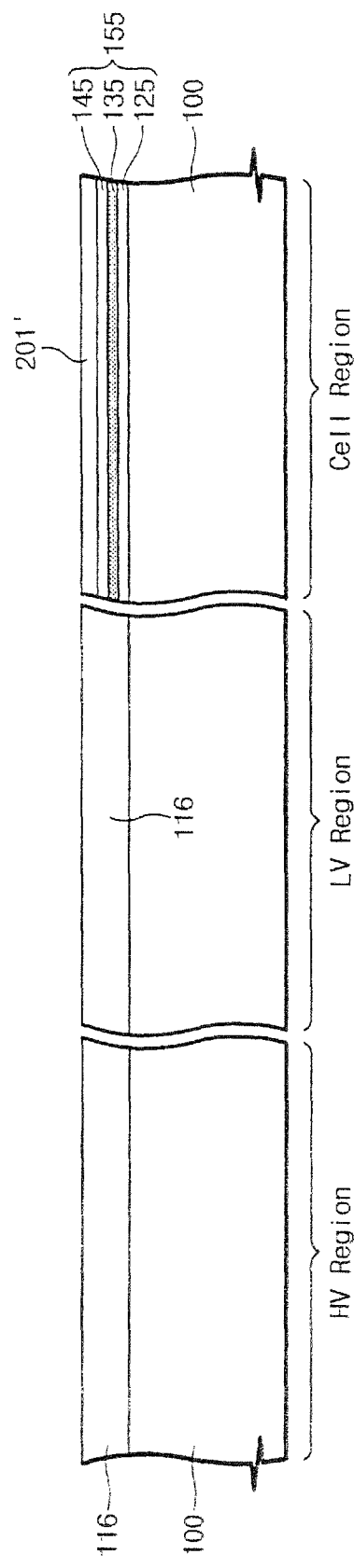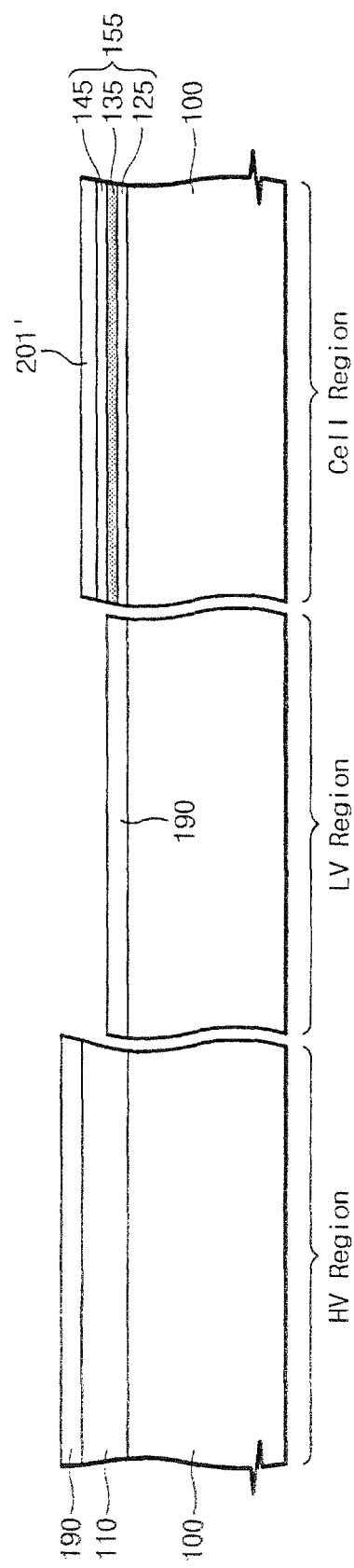

METHOD OF FABRICATING TRAP TYPE NONVOLATILE MEMORY DEVICE

CROSS-REFERENCE TO RELATED APPLICATIONS

This application is a Continuation-in-Part of U.S. patent application Ser. No. 11/459,599, filed on Jul. 24, 2006, now pending, which claims the benefit of foreign priority to Korean Patent Application No. 2005-81350, filed on Sep. 1, 2005, and which is a Continuation-in-Part of U.S. patent application Ser. No. 10/429,153, filed on May 1, 2003, now issued U.S. Pat. No. 7,087,489, and which claims the benefit of foreign priority to Korean Patent Application No. 2002-25014, filed on May 7, 2002, the contents of all of which are incorporated herein by reference in their entirety.

BACKGROUND

1. Field of Invention

Embodiments of the present invention relate generally to methods of fabricating semiconductor devices and, more particularly, to a method of fabricating a nonvolatile memory device with a high dielectric layer being used as an upper insulating layer of a cell gate insulating layer.

2. Description of the Related Art

In general, the memory semiconductor device includes a plurality of cell transistors and functional circuits for operating the plurality of cell transistors. The memory semiconductor devices can be classified into volatile memory devices and nonvolatile memory devices depending on whether or not they can maintain stored information when a power supply is stopped. The volatile memory devices include DRAMs and SRAMs while the nonvolatile memory devices include ROM, EPROM and EEPROM. In keeping with the recent trend toward the portability and miniaturization of the electronic appliances, the demand for these EEPROMs is sharply increasing.

A general type of the EEPROM is a floating gate type flash memory device provided with an electrically insulated conductor, i.e., floating gate. To change the information stored in the cell transistor, the floating gate type flash memory device utilizes the FN tunneling that is a quantum mechanical phenomenon generated owing to a high potential difference. On the functional circuit of the floating gate type flash memory device, a low voltage transistor and a high voltage transistor are disposed together. Generally, the high voltage transistor has a junction region of DDD structure and the low voltage transistor has a junction region of LDD structure. Also, the high voltage transistor has a thicker gate insulating layer, compared with the low voltage transistor. Accordingly, the floating gate type flash memory device three different gate insulating layers for the cell transistor, the high voltage transistor and the low voltage transistor.

However, to simplify the processes, the low voltage transistor and the cell transistor use an oxide simultaneously formed and thus having the same thickness as a gate insulating layer. Therefore, the floating gate type flash memory device uses two different gate insulating layers, i.e., a low voltage gate insulating layer used for both the cell transistor and the low voltage transistor, and a high voltage gate insulating layer used for the high voltage transistor.

Meanwhile, another type of the EEPROM is a trap type flash memory device, which uses an insulating layer as a structure for charge storage instead of the floating gate. The trap type flash memory device includes a cell gate insulating layer comprised of a lower silicon oxide layer, a silicon nitride layer and an upper silicon oxide layer sequentially stacked. The silicon nitride layer that is an insulator is used as the charge storage layer for the trap type flash memory device. Unlike the floating gate type flash memory device, the trap type flash memory device fails to use the low voltage gate insulating layer as the cell gate insulating layer. Accordingly, it is required that the trap type flash memory device be provided with three different thicknesses of gate insulating layer.

In the trap type flash memory device, a method of forming three different thicknesses of gate insulating layer includes forming a high voltage gate insulating layer on a high voltage transistor region. Thereafter, a cell gate insulating layer is formed on an entire surface of a semiconductor substrate including the high voltage gate insulating layer, and is then patterned to form a cell gate insulating layer pattern covering a cell transistor region but exposing a low voltage transistor region and a high voltage transistor region. Thereafter, a low voltage gate insulating layer is formed on an exposed portion of the low voltage transistor region of the semiconductor substrate.

Meanwhile, the patterning of the cell gate insulating layer includes a photolithography and etching process using a photoresist film. At this time, the upper silicon oxide layer has a thin thickness. Therefore, the upper silicon oxide layer is damaged or decreased in thickness during the photolithography process and a subsequent process of removing the photoresist film. Such damage or thinning of the upper silicon oxide layer results in the property deterioration of the trap type semiconductor device.

SUMMARY

Embodiments exemplarily described herein provide a method of fabricating a trap type flash memory device with three different thicknesses of gate insulating layer.

Also, embodiments exemplarily described herein provide a method of fabricating a trap type flash memory device that can prevent a cell gate insulating layer from being damaged.

One embodiment exemplarily described herein can be characterized as a method of fabricating a floating trap type nonvolatile memory device. The method includes forming a cell gate insulating layer on a semiconductor substrate, the cell gate insulating layer being comprised of a lower insulating layer, a charge storage layer and an upper insulating layer sequentially stacked; thermally annealing a resultant substrate including the cell gate insulating layer in a temperature range of approximately 810° C. to approximately 1370° C.; and forming a gate electrode on the thermally annealed cell gate insulating layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 1 through 4 are cross-sectional views illustrating one embodiment of a method of forming a gate insulating layer of a nonvolatile memory device;

FIGS. 6A through 6D, 7A through 7C, 8A through 8C, 9A through 9C, 10A through 10C, 11A through 11C and 12A through 12C are cross-sectional views illustrating a process for forming a gate insulating layer according to various embodiments;

FIGS. 13 through 18 are cross-sectional views illustrating another embodiment of a method of forming a gate insulating layer of a nonvolatile memory device;

DETAILED DESCRIPTION OF THE ILLUSTRATED EMBODIMENTS

Figure 3:
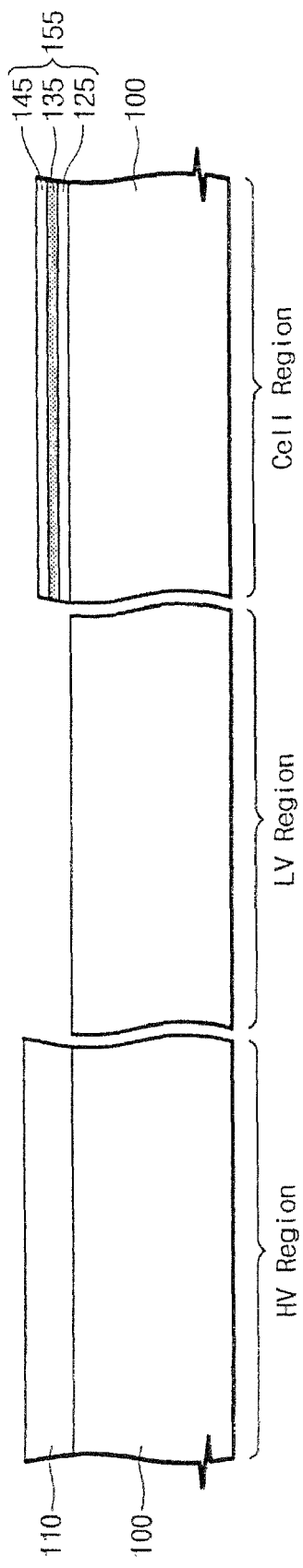

Embodiments of the present invention will now be described more fully with reference to the accompanying drawings. The embodiments may, however, be realized in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

FIGS. 1 through 4 are cross-sectional views illustrating one embodiment of a method of forming a gate insulating layer of a nonvolatile memory device.

Referring to FIG. 1, a device isolation layer (not shown) which defines a high voltage transistor region (hereinafter referred to as 'HV region'), a low voltage transistor region (hereinafter referred to as 'LV region') and a cell array region (referred to as 'cell region') is formed on a selected portion of a semiconductor substrate 100. The device isolation layer is preferably formed by a conventional trench technique, and alternatively it may be formed by employing a self-aligned trench technique after a gate insulating layer is formed. The HV region and the LV region constitute a peripheral circuit region.

A high voltage gate insulating layer pattern 110 is formed on the HV region of the semiconductor substrate 100. A cell gate insulating layer 150 is conformally formed on an entire surface of the semiconductor substrate 100 including the high voltage gate insulating layer 110. The cell gate insulating layer 150 includes a lower insulating layer 120, a charge storage layer 130 and an upper insulating layer 140 sequentially stacked.

The high voltage gate insulating layer pattern 110 is preferably made of a silicon oxide layer by a thermal process. A method for forming the high voltage gate insulating layer pattern 110 will be described in more detail with reference to FIGS. 5A, 5B and 6A through 6D.

The lower insulating layer 120 is preferably formed of a silicon oxide in the thickness of approximately 20 Å to 40 Å. The lower insulating layer 120 is preferably formed by a thermal oxidation process, such as a chemical vapor deposition.

In the nonvolatile memory device, the charge storage layer 130 is used as a material layer for storing charges. Accordingly, the charge storage layer 130 has an energy level by which electrons or holes can be trapped, and has an energy band structure that the trapped charges can be kept by the upper insulating layer 140 and the lower insulating layer 120. For this purpose, the charge storage layer 130 is preferably formed of a silicon nitride layer. Alternatively, a silicon oxynitride layer may be used as the charge storage layer 130. At this time, the charge storage layer 130 is preferably formed in the thickness of approximately 60 Å to approximately 100 Å by an atomic layer deposition or a chemical vapor deposition.

The upper insulating layer 140 is preferably a material layer with an energy band structure that can keep the charges trapped in the charge storage layer. Also, the upper insulating layer 140 is preferably a material layer that can enhance the coupling ratio which is an important parameter in the properties of the typical nonvolatile memory device. In addition, the upper insulating layer 140 is preferably a material layer that can prevent a layer quality from being damaged and the thickness from being decreased, which are the drawbacks mentioned in the related art. To satisfy these requirements, the upper insulating layer 140 is formed of a metal oxide layer, preferably, one selected from a high dielectric material group consisting of an aluminum oxide layer, a hafnium oxide layer and a hafnium silicon oxide layer. Also, the upper insulating layer 140 can be formed from oxides of Group III elements or Group VB elements in the periodic table. Moreover, the upper insulating layer 140 can contain Group IV elements in the periodic table as an impurity atom.

After the upper insulating layer 140 is formed, a thermal annealing process may be further performed at a temperature range of approximately 750° C. to approximately 1,000° C. in an ambient of $NH_3$, $N_2$ and NO gases. The thermal annealing process is performed to crystallize the upper insulating layer 140.

Referring to FIG. 2, a sacrificial layer pattern exposing a peripheral circuit region is formed on the cell gate insulating layer 150.

The forming of the sacrificial layer pattern 200 includes sequentially stacking a sacrificial layer (not shown) and a photoresist film (not shown) on the cell gate insulating layer 150. After that, the photoresist film is patterned using a typical photolithography process to form a photoresist pattern exposing the sacrificial layer of the peripheral circuit region. The sacrificial layer is patterned using the photoresist pattern as an etch mask to form the sacrificial layer pattern 200 exposing the cell gate insulating layer 150 of the peripheral circuit region. After the sacrificial layer pattern 200 is formed, the photoresist pattern is removed.

Preferably, the sacrificial layer pattern 200 is formed of at least one material layer selected from the group consisting of a silicon oxide layer, a silicon nitride layer, a silicon oxynitride layer and a polysilicon layer. Depending on the materials used, various modifications will be possible. Also, like in the various embodiments described later, the photoresist pattern may not be removed in this step. In other words, the photoresist pattern may be further used as an etch mask for etching the cell gate insulating layer 150 and then removed in a subsequent process. Thus, modifications according to the kinds of the used sacrificial layer patterns 200 and modifications according to the removal of the photoresist pattern will be described later with reference to FIGS. 7 through 12.

Referring to FIG. 3, the cell gate insulating layer 150 exposed in the peripheral circuit region and the sacrificial layer pattern 200 of the cell array region are etched. Thus, a cell gate insulating layer pattern 155 including a lower insulating layer pattern 125, a charge storage layer pattern 135 and an upper insulating layer pattern 145 sequentially stacked are formed. The cell gate insulating layer pattern 155 exposes an upper surface of the semiconductor substrate 100 at the low voltage transistor region and an upper surface of the semiconductor substrate 100 at the high voltage transistor region.

An etch process for forming the cell gate insulating layer pattern 155 uses etching properties of the material layers to etchants disclosed in the below table 1.

TABLE 1

| | Etching properties according to kinds of material layers | | | |
|---|---|---|---|---|
| Etchant | Silicon oxide | Silicon nitride | Metal oxide | Polysilicon |
| HF | Good | Bad | Bad | Good (when adding $HNO_3$) |
| LAL | Good | Bad | Good | Bad |
| $HSO_4$ | Bad | Bad | Good | Bad |
| $H_3PO_4$ | Bad | Good | Bad | Bad |

By the etching properties according to the kinds of the material layers disclosed in Table 1 and various kinds of the sacrificial layer patterns 155 numerous embodiments can be realized. These various embodiments will be described in detail with reference to FIGS. 7 through 12.

Figure 4:
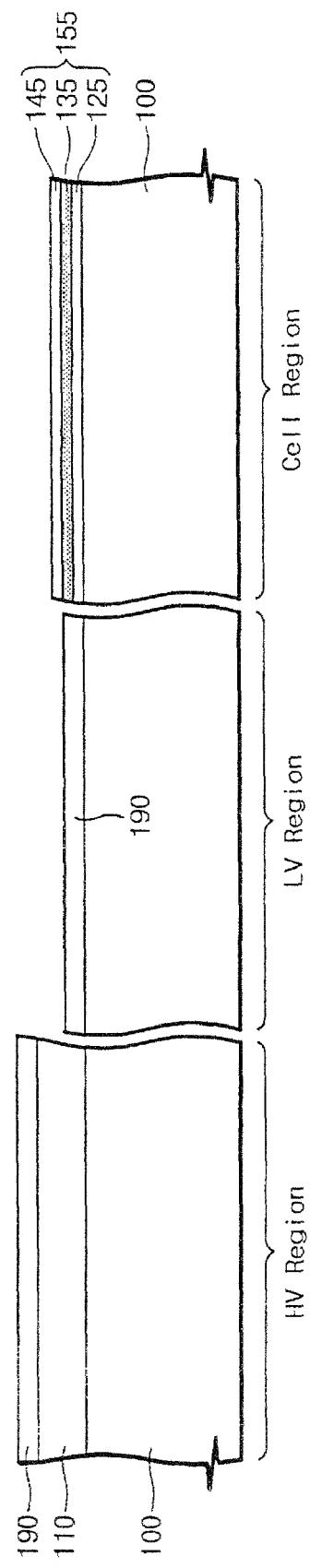

Referring to FIG. 4, an LV gate insulating layer 190 is formed on an exposed surface of the semiconductor substrate 100 at an LV transistor region. The LV gate insulating layer 190 is preferably a silicon oxide layer formed by a thermal oxidation process. When the LV gate insulating layer 190 is formed by a thermal oxidation process, the LV gate insulating layer 190 may be formed even on the HV gate insulating layer pattern 110 of the HV transistor region. Accordingly, it is preferable that the process of forming the HV gate insulating layer pattern 110 described in FIG. 1 consider the thickness of the LV gate insulating layer 190 and the variations in thickness generated by a typical cleaning process performed in each process.

Meanwhile, during the thermal oxidation process for the formation of the LV gate insulating layer 190, the upper insulating layer 140 and the charge storage layer 130 block oxygen from penetrating into the semiconductor substrate 100. Accordingly, the LV gate insulating layer 190 is not formed in the cell array region (CELL region).

Figure 5A:
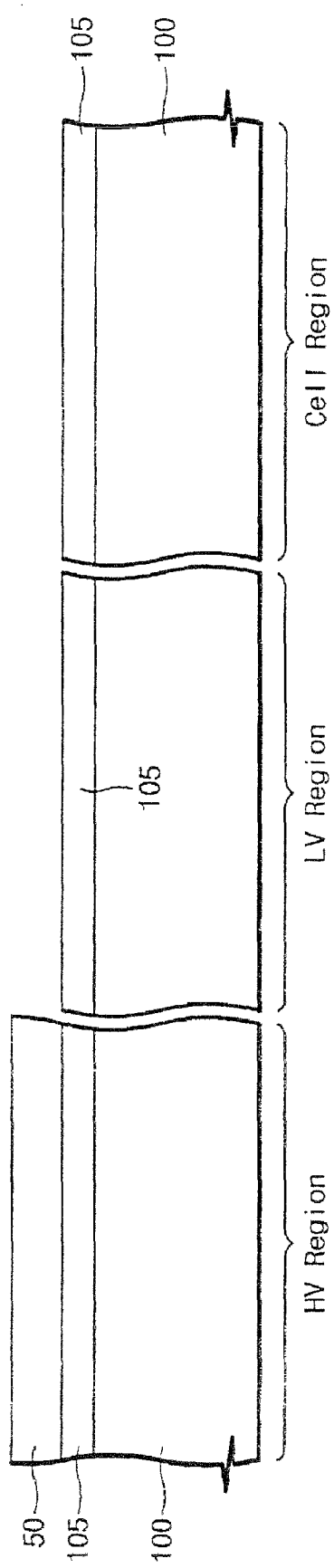
FIGS. 5A and 5B are cross-sectional views illustrating a process for forming an HV gate insulating layer pattern according to an embodiment.
Figure 5B:
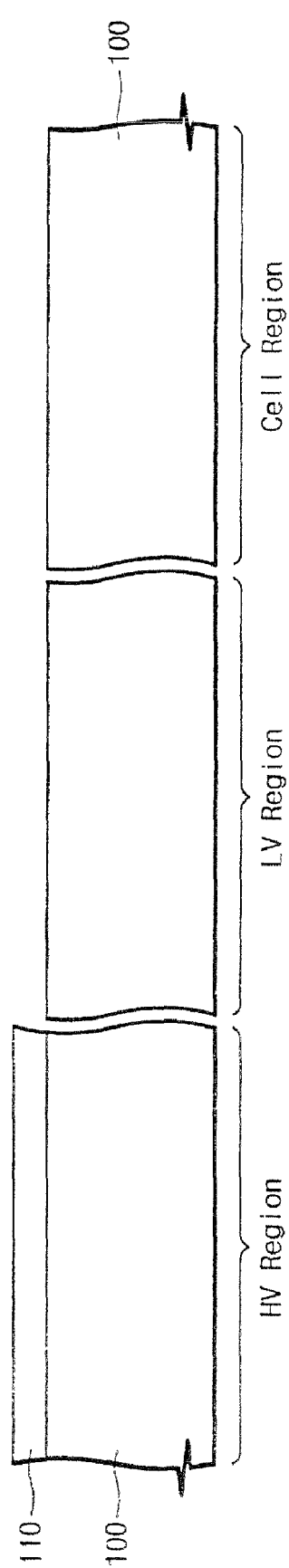

FIGS. 5A and 5B are cross-sectional views illustrating an embodiment for forming the HV gate insulating layer pattern 110 of FIG. 1.

Referring to FIG. 5A, an HV gate insulating layer 105 is formed on the semiconductor substrate 100. The HV gate insulating layer 105 is preferably a thermal oxidation layer formed by a thermal oxidation process. Also, the HV gate insulating layer 105 is formed considering the thickness of the LV gate insulating layer 190 and the decrease in thickness caused by a subsequent cleaning process and the like, as shown in FIG. 4. Preferably, the thickness of the HV gate insulating layer 105 is adjusted such that the sum of the thickness of the LV gate insulating layer 190 and the thickness of the HV gate insulating layer pattern 110 is approximately 300 Å.

A photoresist pattern 50 exposing the LV transistor region (LV region) and the cell array region (CELL region) is formed on the HV gate insulating layer 105.

Referring to FIG. 5B, the exposed HV gate insulating layer 105 is etched by using the photoresist pattern 50 as an etch mask to form the HV gate insulating layer pattern 110. The etching process for forming the HV gate insulating layer pattern 110 may be an isotropic etching or an anisotropic etching.

FIGS. 6A through 6D are cross-sectional views illustrating another embodiment for forming the HV gate insulating layer pattern 110 described in FIG. 1.

Figure 6A:
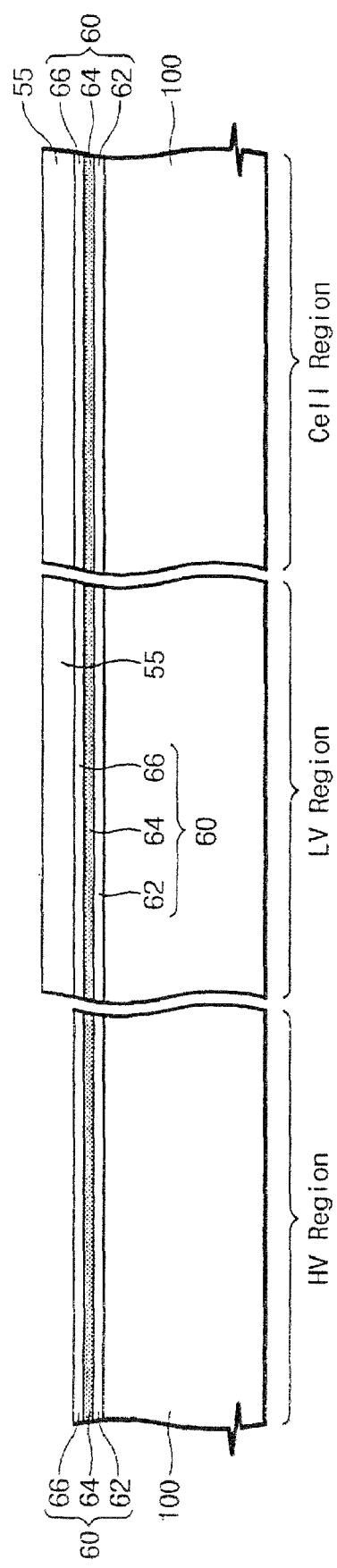

Referring to FIG. 6A, a mask film 60 including a lower mask film 62, a middle mask film 64 and an upper mask film 66 sequentially stacked is formed on the semiconductor substrate 100.

The lower mask film 62 is preferably a silicon oxide layer formed by a thermal oxidation process, such as a chemical vapor deposition process. The middle mask film 64 and the upper mask film 66 are preferably a silicon nitride film and a silicon oxide film formed by a chemical vapor deposition process.

A photoresist pattern 55 exposing the upper mask film 66 of the HV transistor region (HV region) is formed on the mask film 60.

Figure 6B:
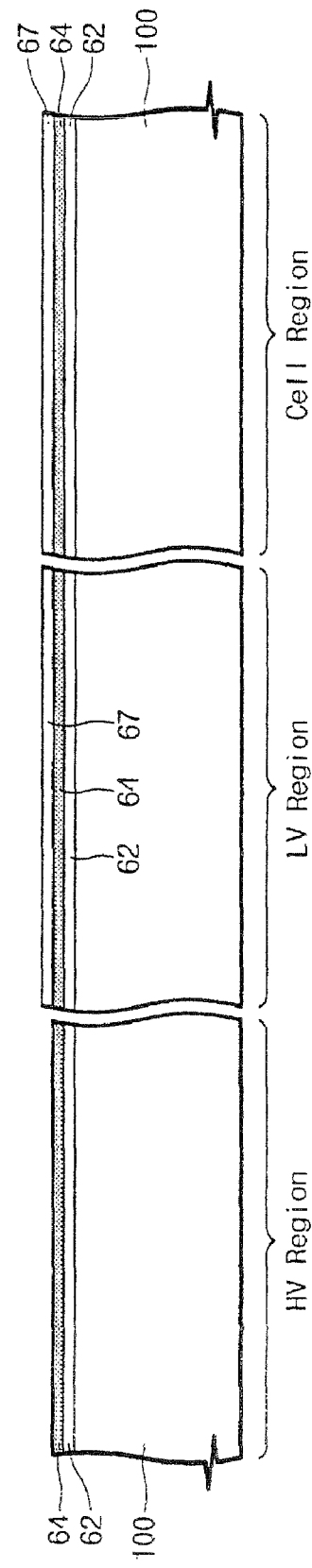

Referring to FIG. 6B, the exposed upper mask film 66 is etched by using the photoresist pattern 55 as an etch mask, so that an upper mask film pattern 67 exposing the middle mask film 64 of the HV region is formed.

The etching process for forming the upper mask film pattern 67 may be an isotropic etching or an anisotropic etching. Thereafter, the photoresist pattern 55 is removed to thereby expose the upper mask film pattern 67.

Figure 6C:
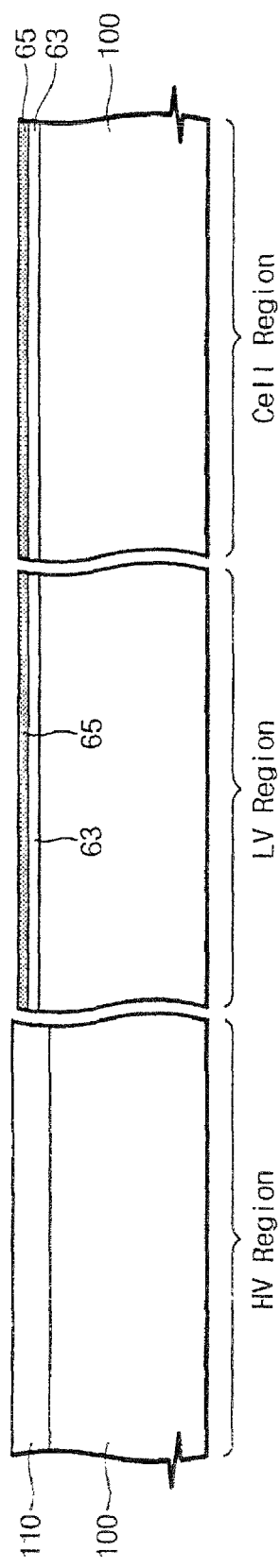

Referring to FIG. 6C, the exposed middle mask film 64 is etched by using the upper mask film pattern 67 as an etch mask, so that a middle mask film pattern 65 exposing the lower mask film 62 of the HV region is formed.

The etching process for forming the middle mask film pattern 65 is preferably an isotropic etching which uses a phosphoric acid ($H_3PO_4$) as an etchant. Also, an etching process for etching the lower mask film 62, thereby forming a lower mask film pattern 63, is preferably performed by an isotropic etching using an etch recipe having an etching selectivity to the semiconductor substrate 100.

An HV gate insulating layer pattern 110 is then formed on the exposed semiconductor substrate 100. The HV gate insulating layer pattern 110 is preferably formed by a thermal oxidation process. At this time, the HV gate insulating layer pattern 110 is not formed on the LV region and CELL region due to the remaining lower mask film pattern 63 and middle mask film pattern 65.

Figure 6D:
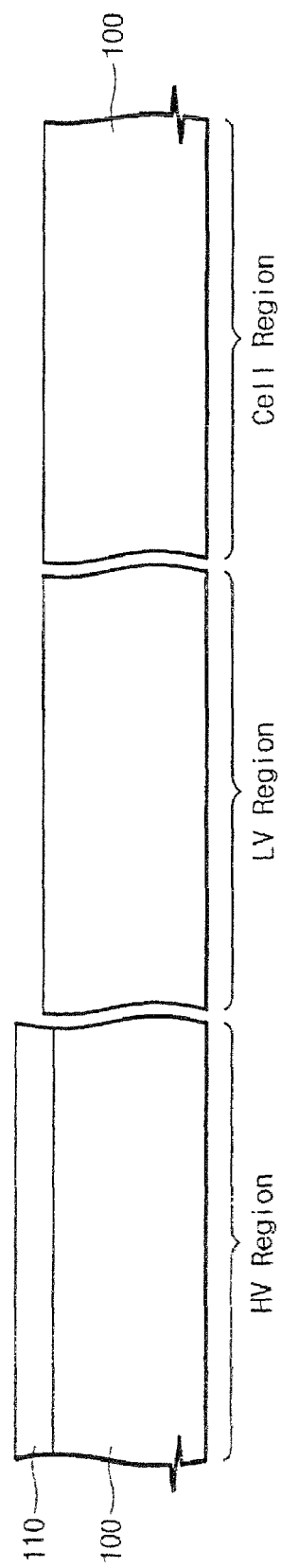

Referring to FIG. 6D, the remaining lower mask film pattern 63 and middle mask film pattern 65 are removed. At this time, the lower mask film pattern 63 and middle mask film pattern 65 are preferably removed by an isotropic etching using a phosphoric acid and a hydrofluoric acid (HF).

FIGS. 7A through 7C, 8A through 8C, 9A through 9C, 10A through 10C, 11A through 11C and 12A through 12C are cross-sectional views illustrating embodiments modified according to kinds of the sacrificial layer pattern described in FIG. 2.

Figure 7A:
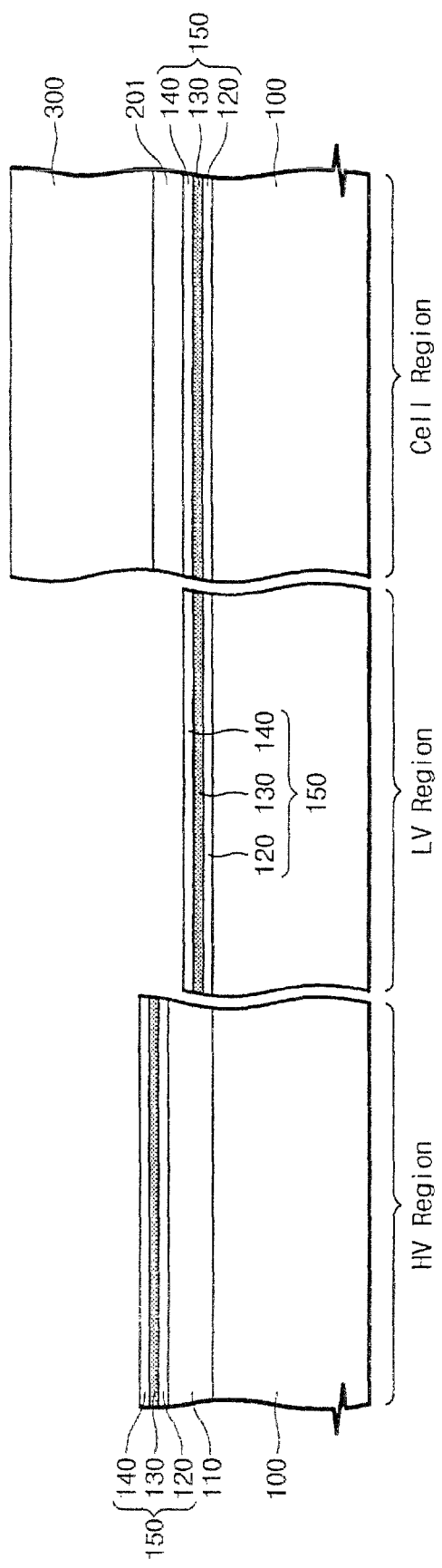

Referring to FIGS. 1 and 7A, a silicon oxide layer which is to be used as the sacrificial layer pattern 200 is formed on the cell gate insulating layer 150. A photoresist pattern 300 exposing a peripheral circuit region is formed on the silicon oxide layer. The silicon oxide layer is patterned by using the photoresist pattern 300 as an etch mask to form a silicon oxide layer pattern 201 exposing the upper insulating layer 140 of the peripheral circuit region.

At this time, the silicon oxide layer is preferably formed by a chemical vapor deposition process. Also, the etching process for forming the silicon oxide layer pattern 201 is preferably performed by an anisotropic etching or alternatively by an isotropic etching using HF.

Figure 7B:
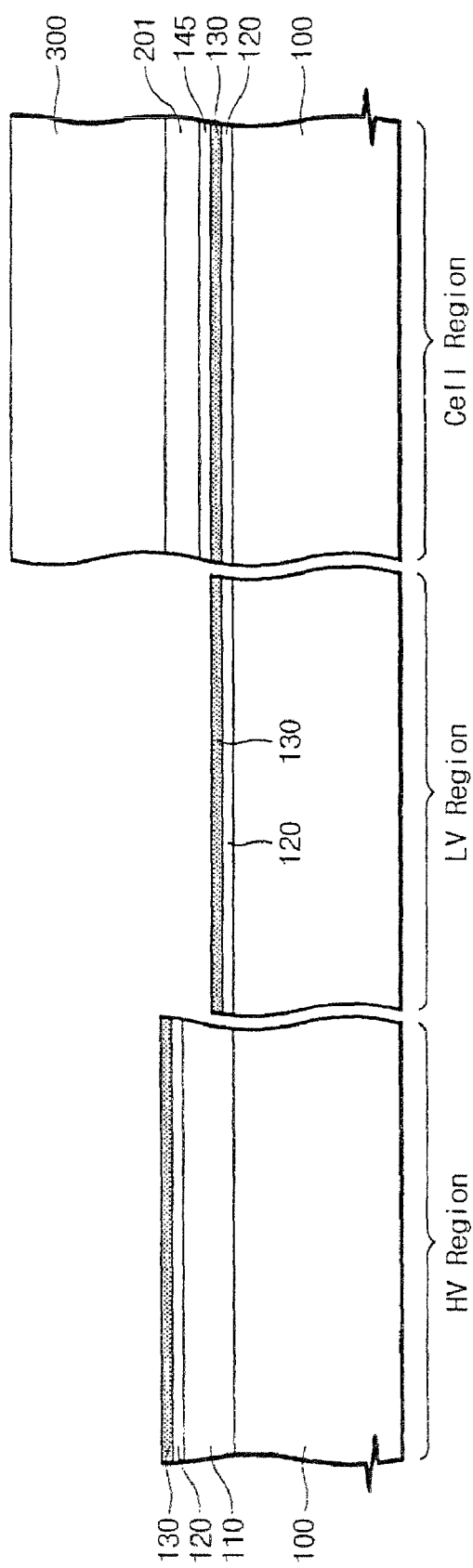

Referring to FIG. 7B, the exposed upper insulating layer 140 is etched by using the photoresist pattern 300 as an etch mask, so that an upper insulating layer pattern 145 exposing the charge storage layer 130 of the peripheral circuit region is formed. Considering the etching properties depending on the kinds of the material layers shown in the table 1, the etching process for forming the upper insulating layer is preferably performed using $H_2SO_4$ or LAL. The etching process may be performed by an anisotropic etching.

The upper insulating layer pattern 145 may be formed by replacing the etching process for forming the silicon oxide layer pattern with an over-etching process. In this case, the over-etching process is preferably performed using LAL as an etchant.

Referring to FIGS. 3 and 7C, the photoresist pattern 300 is removed to expose the silicon oxide layer pattern 201 of the CELL region. The exposed charge storage layer 130 is etched using the silicon oxide layer pattern 201 as an etch mask, so that a charge storage layer pattern 135 exposing the lower insulating layer 120 of the peripheral circuit region is formed. The etching process for forming the charge storage layer pattern 135 is preferably performed using a phosphoric acid ($H_3PO_4$) as an etchant.

Thereafter, the exposed lower insulating layer 120 is etched to form a lower insulating layer pattern 125 exposing the semiconductor substrate 100 of the LV region. The etching process for forming the lower insulating layer pattern 125 is performed such that the silicon oxide layer pattern 201 is etched together with the layer for forming the lower insulating layer pattern 125. For this purpose, the etching process for forming the lower insulating layer pattern 125 is preferably a wet etch using a hydrofluoric acid (HF) as an etchant. As shown in the above table 1, the upper insulating layer pattern 145 made of a metal oxide has a superior etch selectivity to the HF. Accordingly, it is possible to form the cell gate insulating layer pattern 155 without an etch damage. As a result, the resultant structure shown in FIG. 3 is obtained.

Meanwhile, the etching process for forming the lower insulating layer pattern 125 may be performed such that the silicon oxide layer pattern 201 remains on the upper insulating layer pattern 145. For this purpose, the silicon oxide layer is preferably formed thicker than the lower insulating layer 120.

FIGS. 8A through 8C are cross-sectional views showing an embodiment in which a silicon nitride layer is used to form the sacrificial layer pattern 200.

Referring to FIGS. 8A through 8C, a silicon nitride layer which is to be used as the sacrificial layer pattern 200 is formed on the cell gate insulating layer 150. A photoresist pattern 300 exposing the peripheral circuit region is formed on the silicon nitride layer. The silicon nitride layer is patterned using the photoresist pattern 300 as an etch mask to form a silicon nitride layer pattern 202 exposing the upper insulating layer 140 of the peripheral circuit region.

At this time, the silicon nitride layer is preferably formed by a chemical vapor deposition. Also, the etching process for forming the silicon nitride layer pattern 202 is preferably performed by an anisotropic etching.

Referring to FIG. 8B, the exposed upper insulating layer 140 is etched using the photoresist pattern 300 as an etch mask, so that an upper insulating layer pattern 145 exposing the charge storage layer 130 of the peripheral circuit region is formed. Considering the etching properties depending on the kinds of the material layers shown in the table 1, the etching process for forming the upper insulating layer pattern 145 is preferably performed using $H_2SO_4$ or LAL.

Thereafter, the photoresist pattern 300 is removed to expose the silicon nitride layer pattern 202 of the cell array region.

Referring to FIGS. 3 and 8C, the exposed silicon nitride layer pattern 202 is etched together with the charge storage layer 130, so that a charge storage layer pattern 135 exposing the lower insulating layer 120 of the peripheral circuit region is formed and an upper surface of the upper insulating layer pattern 145 is exposed. The etching process for forming the charge storage layer pattern 135 is preferably performed using a phosphoric acid as an etchant.

Thereafter, the exposed lower insulating layer 120 is etched to form a lower insulating layer pattern 125 exposing the semiconductor substrate 100 of the LV region. The etching process for forming the lower insulating layer pattern 125 is performed by a wet etch using a hydrofluoric acid (HF) as an etchant. At this time, the upper insulating layer pattern 145 made of a metal oxide has a superior etch selectivity to the HF. As a result, a resultant structure shown in FIG. 3 is obtained.

The embodiment described with reference to FIGS. 8A through 8C can be equally applied to a case that a silicon oxynitride layer is used as the sacrificial layer pattern 200.

FIGS. 9A through 9C are cross-sectional views showing an embodiment in which a silicon oxide layer and a silicon nitride layer sequentially stacked are used as the sacrificial layer pattern 200.

Referring to FIGS. 1 and 9A, a silicon oxide layer and a silicon nitride layer which are to be used as the sacrificial layer pattern 200 are sequentially formed on the cell gate insulating layer 150. A photoresist pattern 300 exposing the peripheral circuit region is formed on the silicon nitride layer. The silicon nitride layer and the underlying silicon oxide layer are sequentially patterned using the photoresist pattern 300 as an etch mask to thereby form the sacrificial layer pattern 200 comprised of a silicon oxide layer pattern 203 and a silicon nitride layer pattern 204 sequentially stacked on the upper insulating layer, the sacrificial layer pattern 200 exposing the upper insulating layer 140 of the peripheral circuit region.

At this time, the silicon oxide layer and the silicon nitride layer are preferably formed by a chemical vapor deposition. Also, the etching process for forming the sacrificial layer pattern 200 is preferably performed by an anisotropic etching.

Referring to FIG. 9B, the exposed upper insulating layer 140 is etched using the photoresist pattern 300 as an etch mask, so that an upper insulating layer pattern 145 exposing the charge storage layer 130 of the peripheral circuit region is formed. The etching process for forming the upper insulating layer pattern 145 is preferably performed using $H_2SO_4$ or LAL. The etching process may be performed by an anisotropic etching. Also, the upper insulating layer pattern 145 may be formed by the over-etching described with reference to FIG. 7A.

Thereafter, the photoresist pattern 300 is removed to expose the silicon nitride layer pattern 204 of the cell array region.

Referring to FIGS. 3 and 9C, the exposed silicon nitride layer pattern 204 and the charge storage layer 130 are etched together, so that a charge storage layer pattern 135 exposing the lower insulating layer 120 of the peripheral circuit region is formed and an upper surface of the upper insulating layer pattern 145 is exposed. The etching process for forming the charge storage layer pattern 135 is preferably performed using a phosphoric acid as an etchant.

Thereafter, the exposed lower insulating layer 120 is etched to form a lower insulating layer pattern 125 exposing the semiconductor substrate 100 of the LV region. The etching process for forming the lower insulating layer pattern 125 is performed by a wet etch using a hydrofluoric acid (HF) as an etchant. At this time, the upper insulating layer pattern 145 made of a metal oxide has a superior etch selectivity to the HF. As a result, a resultant structure shown in FIG. 3 is obtained.

The embodiment described with reference to FIGS. 8A through 8C can be equally applied to a case that a silicon oxynitride layer is used as the sacrificial layer pattern 200.

Figure 10A:
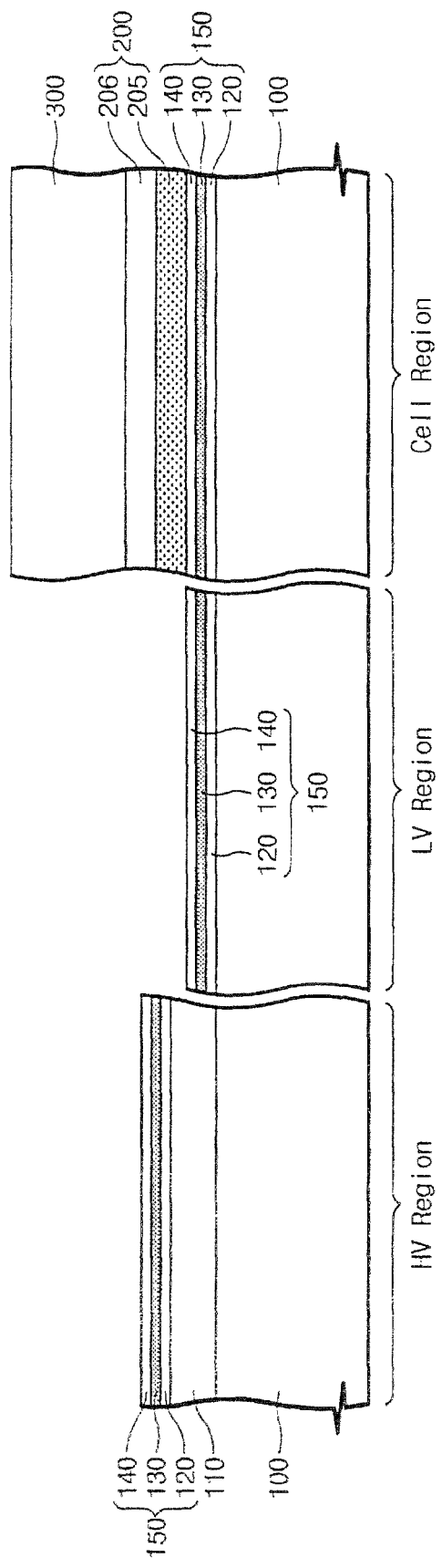

FIGS. 10A through 10C are cross-sectional views showing an embodiment in which a silicon nitride layer and a silicon oxide layer sequentially stacked are used as the sacrificial layer pattern 200.

Referring to FIGS. 1 and 10A, a silicon nitride layer and a silicon oxide layer are sequentially formed on the cell gate insulating layer 150. A photoresist pattern 300 exposing the peripheral circuit region is formed on the silicon oxide layer. The silicon nitride layer and the silicon oxide layer are sequentially patterned using the photoresist pattern 300 as an etch mask, so that the sacrificial layer pattern 200 is formed, which is comprised of a silicon nitride layer pattern 205 and a silicon oxide layer pattern 206 sequentially stacked on the upper insulating layer, and exposes the upper insulating layer 140 of the peripheral circuit region.

At this time, the silicon nitride layer and the silicon oxide layer are preferably formed by a chemical vapor deposition. Also, the etching process for forming the sacrificial layer pattern 200 is preferably performed by an anisotropic etching.

Referring to FIG. 10B, the photoresist pattern 300 is removed to expose the silicon oxide layer pattern 206. Thereafter, the exposed upper insulating layer 140 and the silicon oxide layer pattern 206 are etched together, so that an upper insulating layer pattern 145 exposing the charge storage layer 130 of the peripheral circuit region is formed. Simultaneously with this, the silicon nitride layer pattern 205 is exposed on the CELL region. The etching process for forming the upper insulating layer pattern 145 is preferably performed by an isotropic etching using $H_2SO_4$ or LAL. Alternatively, the etching process may be performed by an anisotropic etching.

Referring to FIG. 10C, the exposed silicon nitride layer pattern 204 and the charge storage layer 130 are etched together, which is the same as that described with reference to FIG. 8C.

Figure 11A:
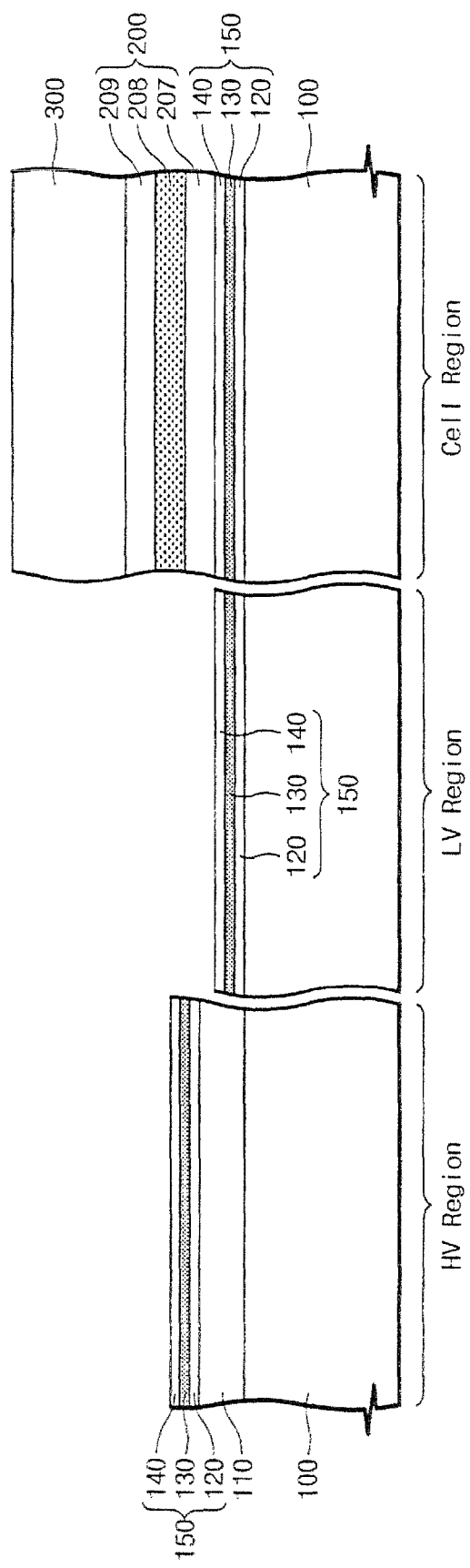
Figure 11B:
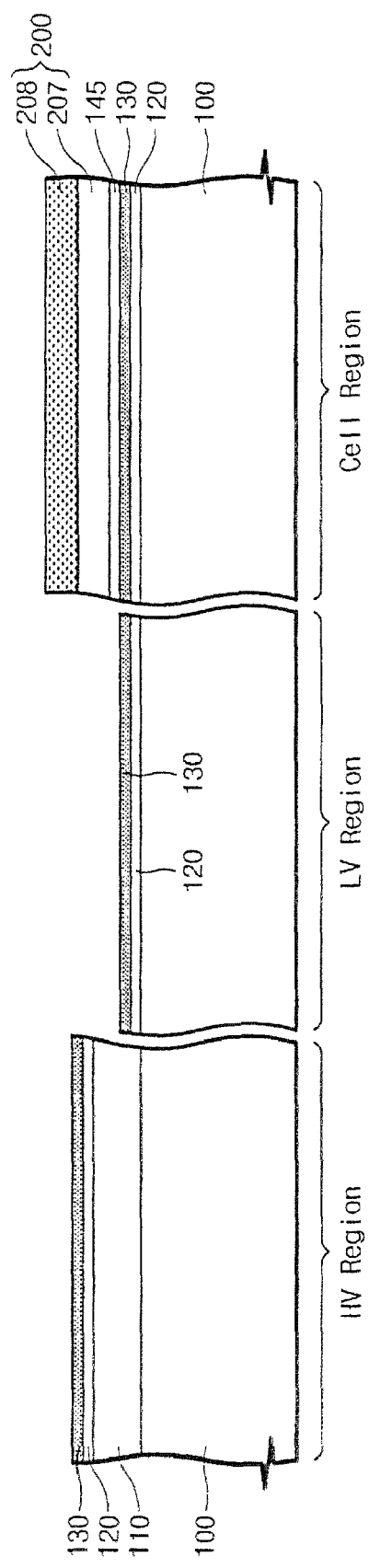
Figure 11C:
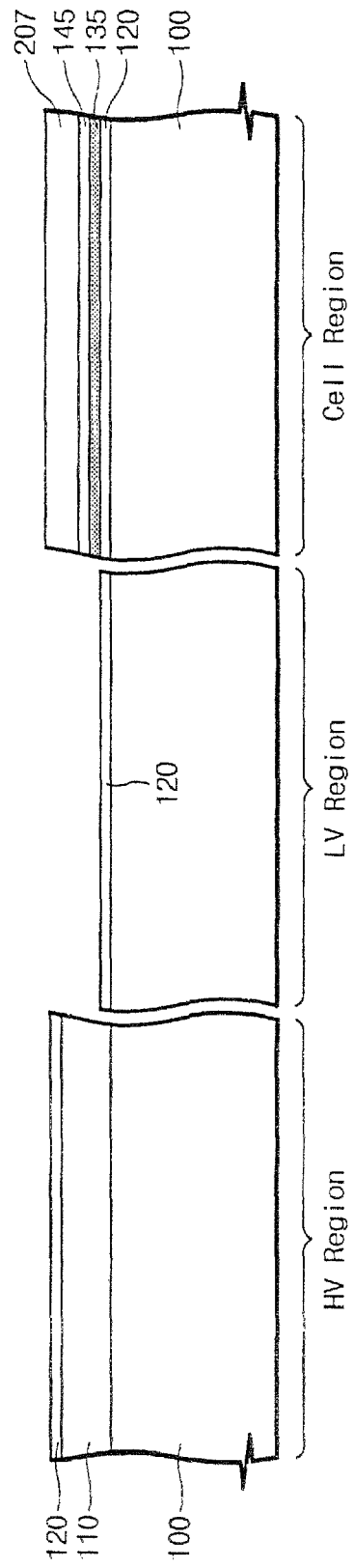
Figure 13:
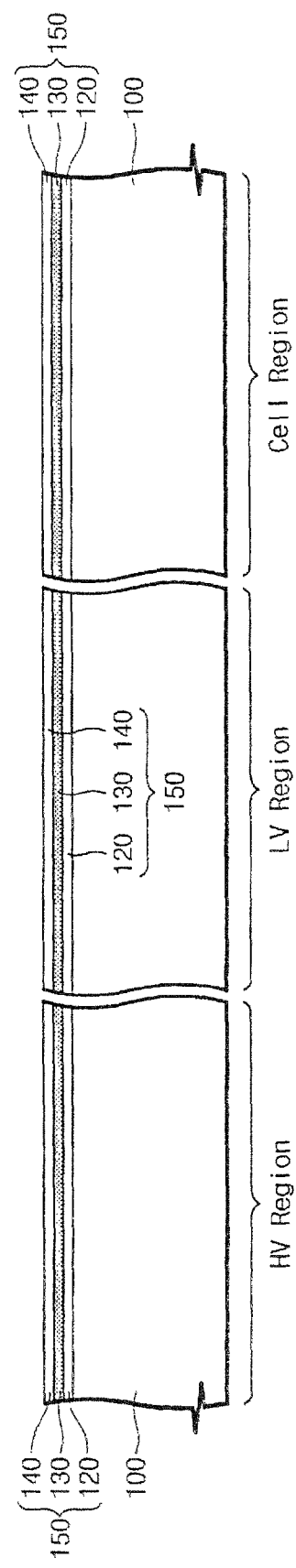
Figure 14:
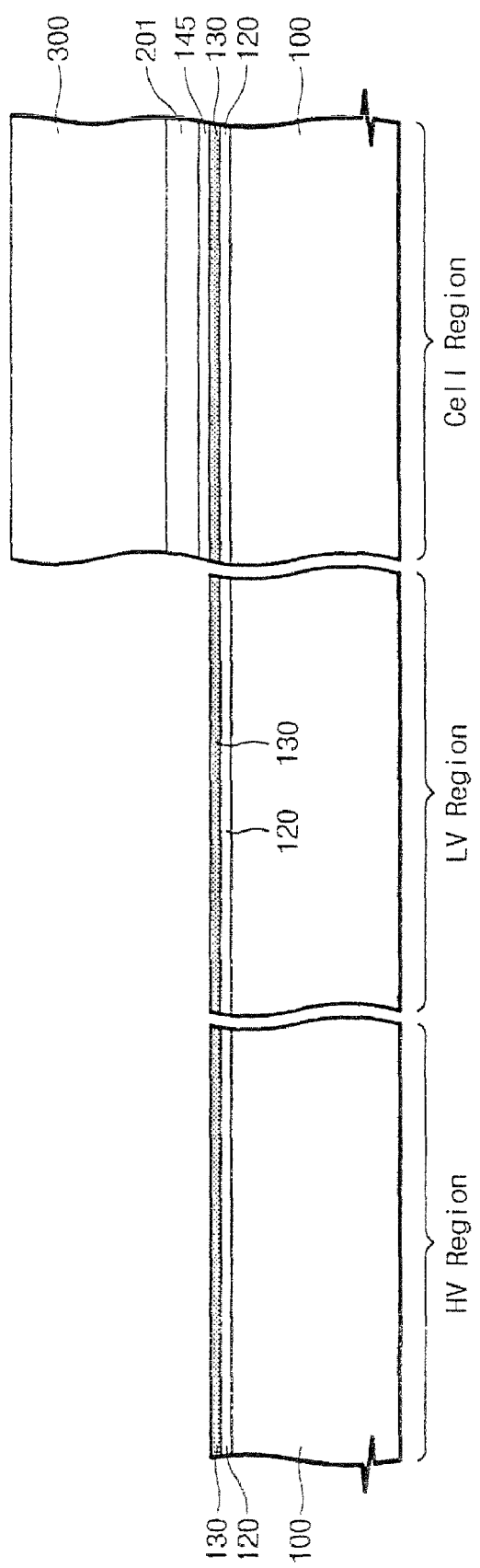
Figure 19:
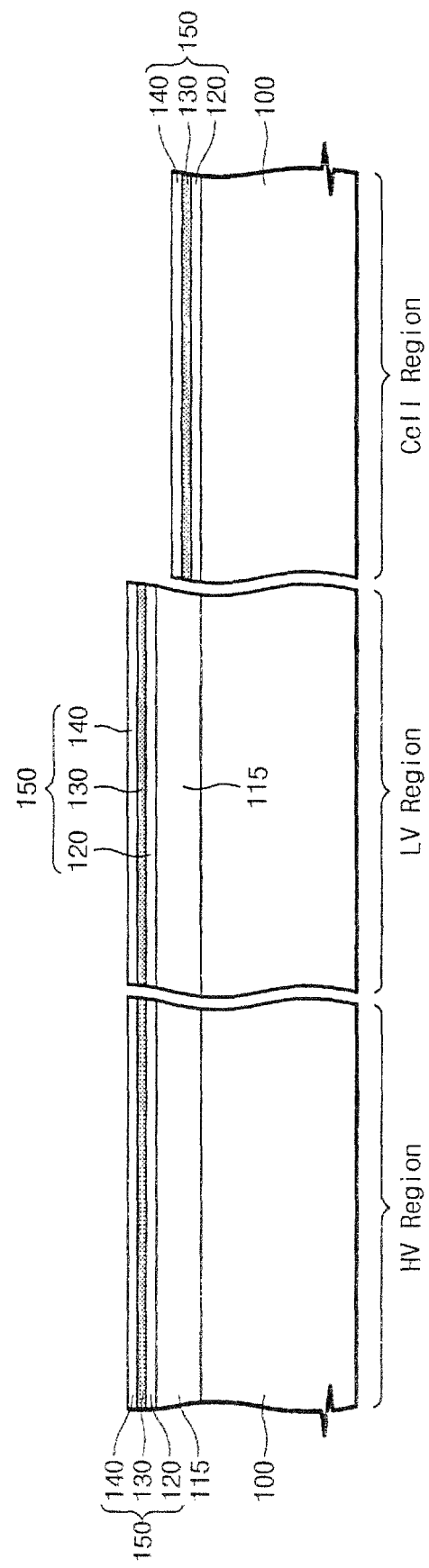
FIGS. 19 through 24 are cross-sectional views illustrating yet another embodiment of a method of forming a gate insulating layer of a nonvolatile memory device.
Figure 20:
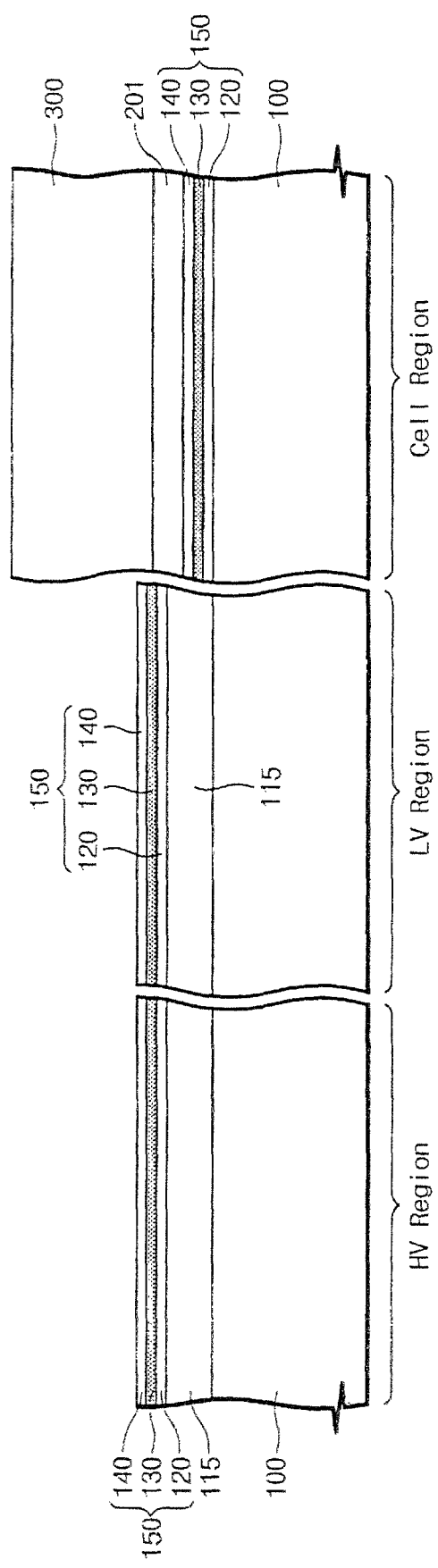
Figure 21:
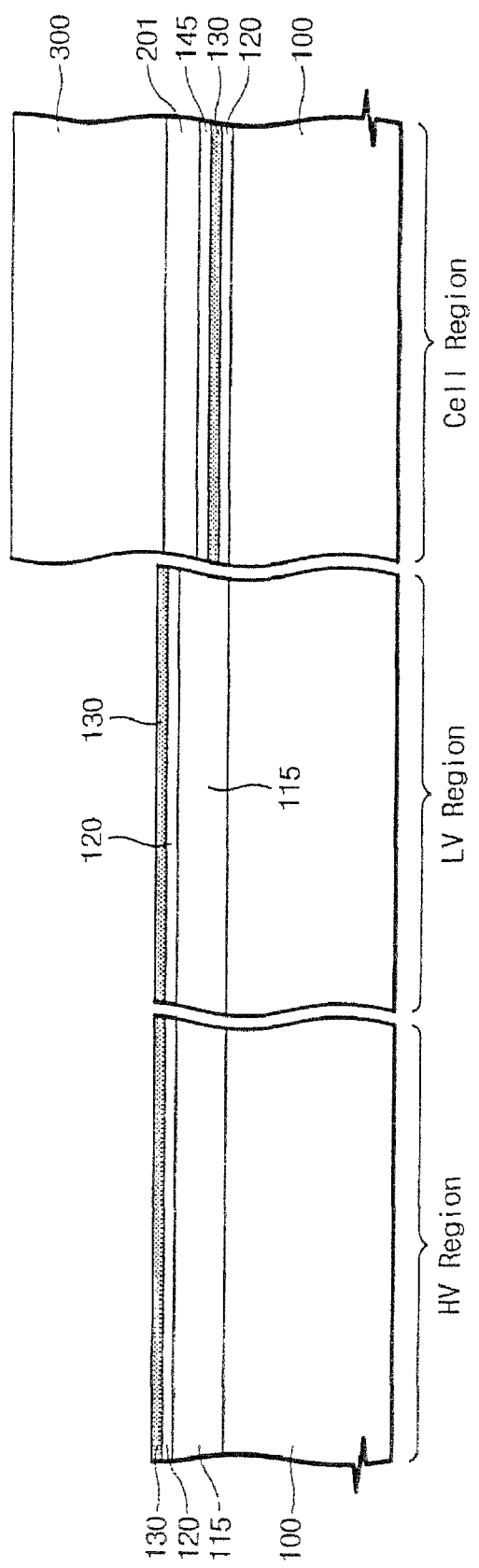
Figure 22:
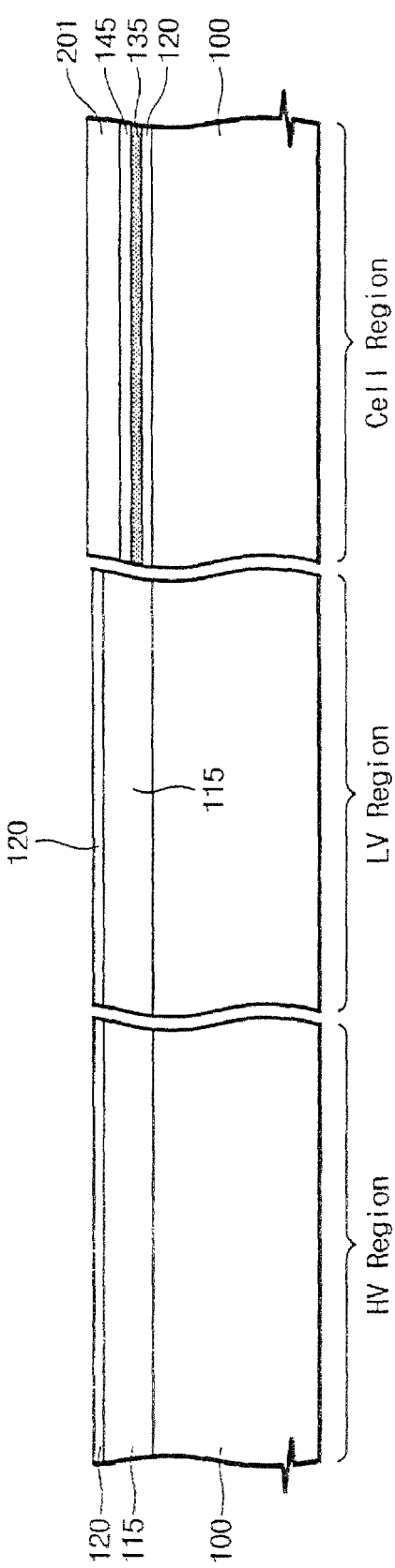

FIGS. 11A through 11C are cross-sectional views showing an embodiment in which a silicon oxide layer, a silicon nitride layer and a silicon oxide layer sequentially stacked are used as the sacrificial layer pattern 200.

Referring to FIGS. 1 and 11A, a lower silicon oxide layer, a silicon nitride layer and an upper silicon oxide layer are sequentially formed on the cell gate insulating layer 150. A photoresist pattern 300 exposing the peripheral circuit region is formed on the upper silicon oxide layer. The lower silicon oxide layer, the silicon nitride layer and the silicon oxide layer are sequentially patterned using the photoresist pattern 300 as an etch mask, so that the sacrificial layer pattern 200 is formed, which exposes the upper insulating layer 140 of the peripheral circuit region and is comprised of a lower silicon oxide layer pattern 207, a silicon nitride layer pattern 208 and an upper silicon oxide layer pattern 209 sequentially stacked on the upper insulating layer.

At this time, the upper/lower silicon oxide layer pattern 209/207 and the silicon nitride layer pattern 208 are preferably formed by a chemical vapor deposition. Also, the etching process for forming the sacrificial layer pattern 200 is preferably performed by an isotropic etching or an anisotropic etching.

Referring to FIG. 11B, the photoresist pattern 300 is removed to expose the upper silicon oxide layer pattern 209. Thereafter, the exposed upper insulating layer 140 and the upper silicon oxide layer pattern 209 are etched together, so that an upper insulating layer pattern 145 exposing the charge storage layer 130 of the peripheral circuit region is formed. The etching process for forming the upper insulating layer pattern 145 is preferably performed by an isotropic etching using LAL, which can etch a metal oxide and a silicon oxide together. Alternatively, the upper insulating layer pattern 145 may be formed by an over-etching described with reference to FIG. 7A.

Referring to FIGS. 3 and 11C, the exposed silicon nitride layer pattern 208 and the charge storage layer 130 are etched together, so that a charge storage layer pattern 135 exposing the lower insulating layer 120 of the peripheral circuit region is formed beneath the upper insulating layer pattern 145. Simultaneously with this, an upper surface of the lower silicon oxide layer pattern 207 is exposed. The etching process for forming the lower silicon oxide layer pattern 207 is preferably performed using a hydrofluoric acid (HF) as an etchant.

Thereafter, the exposed lower insulating layer 120 and the lower silicon oxide layer pattern 207 are etched to expose the semiconductor substrate 100 of the LV region and the upper insulating layer pattern. As a result, a lower insulating layer pattern 125 is formed beneath the charge storage layer pattern 135 and the upper insulating layer pattern 145 is exposed. The etching process for forming the lower insulating layer pattern 125 is preferably performed by a wet etch using a hydrofluoric acid (HF) as an etchant, and is the same as that described with reference to FIG. 7C.

FIGS. 12A through 12C are cross-sectional views showing an embodiment in which a polysilicon layer is used as the sacrificial layer pattern 200.

Referring to FIGS. 1 and 12A, a polysilicon layer which is to be used as the sacrificial layer pattern 200 is formed on the cell gate insulating layer 150. A photoresist pattern 300 exposing a peripheral circuit region is formed on the polysilicon layer. The polysilicon layer is patterned by using the photoresist pattern 300 as an etch mask to form a polysilicon layer pattern 210 exposing the upper insulating layer 140 of the peripheral circuit region.

At this time, the polysilicon layer is preferably formed by a chemical vapor deposition process. Also, the etching process for forming the polysilicon layer pattern 210 is preferably performed by an anisotropic etching.

Referring to FIG. 12B, the exposed upper insulating layer 140 is etched by using the photoresist pattern 300 as an etch mask, so that an upper insulating layer pattern 145 exposing the charge storage layer 130 of the peripheral circuit region is formed. Considering the etching properties depending on the kinds of the material layers shown in the above table 1, the etching process for forming the upper insulating layer is preferably performed using $H_2SO_4$ or LAL.

Thereafter, the photoresist pattern 300 is removed to expose the polysilicon layer pattern 210 of the CELL region. The exposed charge storage layer 130 is etched using the polysilicon layer pattern 201 as an etch mask, so that a charge storage layer pattern 135 exposing the lower insulating layer 120 of the peripheral circuit region is formed. The etching process for forming the charge storage layer pattern 135 is preferably performed using a phosphoric acid ($H_3PO_4$) as an etchant.

Referring to FIGS. 3 and 12C, the exposed polysilicon layer pattern 210 is etched to expose the upper insulating layer pattern 145. The etching process for removing the polysilicon layer pattern 210 is preferably performed by using a solution of a nitric acid ($HNO_3$), a hydrofluoric acid (HF) and an acetic acid as an etchant. The nitric acid oxidizes the polysilicon layer pattern 210 to form a silicon oxide layer. The hydrofluoric acid removes the oxidized polysilicon layer pattern 210. The acetic acid functions to dilute the etchant and accelerate the oxidation of the polysilicon layer pattern 210.

Meanwhile, the hydrofluoric acid etches the exposed lower insulating layer 120 as well as the oxidized polysilicon layer pattern, so that a lower insulating layer pattern 125 exposing the semiconductor substrate 100 of the LV region. At this time, the upper insulating layer pattern 145 made of a metal oxide is not etched during the above etch process. As a result, the resultant structure shown in FIG. 3 is obtained.

FIGS. 13 through 18 are cross-sectional views illustrating another embodiment of a method of forming a gate insulating layer of a nonvolatile memory device.

Referring to FIGS. 13 through 18, this embodiment is characterized by forming a cell gate insulating layer pattern comprised of a lower insulating layer 120, a charge storage layer and an upper insulating layer 140 sequentially stacked on the semiconductor substrate 100 and forming an HV gate insulating layer 116. That is, this embodiment is characterized in that the order of forming the cell gate insulating layer pattern 150 and the HV gate insulating layer pattern 110 is changed, when compared with the embodiment described with reference to FIGS. 1 through 4.

Meanwhile, the embodiment shown in FIGS. 13 through 18 uses a silicon oxide layer pattern 201 (shown in FIG. 14) as the sacrificial layer pattern. Since the detailed description related with this process has been made in the embodiment with reference to FIGS. 7A through 7C, its repeated description will be omitted. Also, the sacrificial layer pattern can be formed from a silicon oxide layer and a silicon nitride layer sequentially stacked or a silicon oxide layer, a silicon nitride layer and a silicon oxide layer sequentially stacked, and methods of using the sacrificial layer pattern are the same as those described with reference to FIGS. 9A through 9C and FIGS. 11A through 11C. In each case, the silicon nitride layer can be replaced by a silicon oxynitride layer.

However, this embodiment is preferably performed by allowing a silicon oxide layer pattern 201' (shown in FIG. 16) used as the sacrificial layer pattern to remain on the cell gate insulating layer pattern 155. A method of allowing the silicon oxide layer pattern to remain is the same as that described with reference to FIG. 7C, and is to prevent the problem of the related art occurring when the cell gate insulating layer pattern 155 contacts the photoresist pattern. In other words, referring to FIGS. 17 and 18, in order to form an LV gate insulating layer 190 on the LV region, a photoresist pattern (not shown) exposing the LV region is formed. However, the cell gate insulating layer pattern 155 does not contact the photoresist pattern by the remaining silicon oxide layer pattern 201'. Thereafter, as shown in the drawings, an LV gate insulating layer 190 is formed on the exposed LV region.

FIGS. 19 through 24 are cross-sectional views illustrating yet another embodiment of a method of forming a gate insulating layer of a nonvolatile memory device. This embodiment is characterized by forming an HV gate insulating layer 115 on the LV region as well as on the HV region, prior to forming the cell gate insulating layer 150.

Referring to FIGS. 19 through 22, a silicon oxide layer is used as a sacrificial layer pattern. A lower insulating layer 120 of a peripheral circuit region is exposed using an etch selectivity between a cell gate insulating layer 150 and a silicon oxide layer pattern 201 used as the sacrificial layer pattern. This method is the same as that described with reference to FIGS. 7A through 7C.

Figure 23:
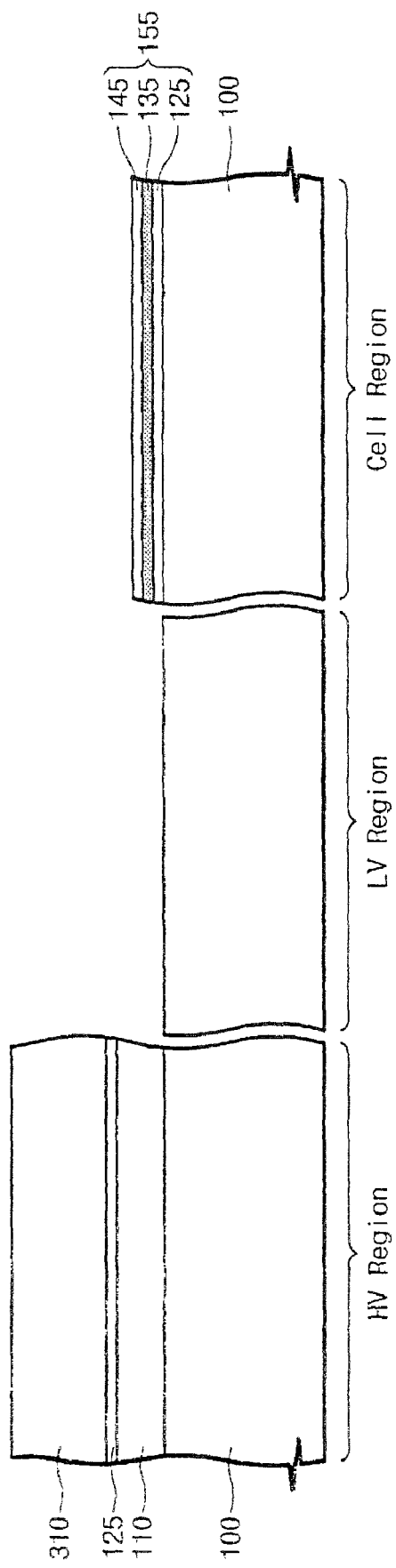

Referring to FIG. 23, a photoresist pattern 310 covering the HV region is formed on the exposed lower insulating layer 120. The silicon oxide layer pattern 201, and the lower insulating layer 120 and the HV gate insulating layer 115 of the LV region are etched using the photoresist pattern 310 as an etch mask, so that an HV gate insulating layer pattern 110 and a lower insulating layer pattern 125 sequentially stacked are formed on the HV region. At this time, the upper insulating layer pattern 145 of the cell array region (CELL region) and the semiconductor substrate 100 of the LV region are exposed.

Figure 24:
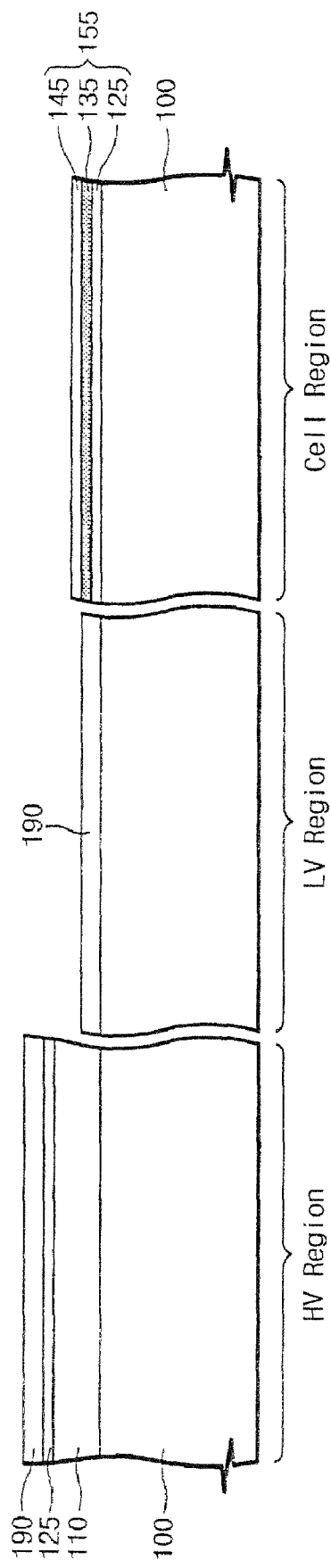

Referring to FIG. 24, the photoresist pattern 310 is removed. Thereafter, an LV gate insulating layer 190 is formed on the LV region through a thermal oxidation process. At this time, as shown in FIG. 4, the LV gate insulating layer 190 is formed even on the lower insulating layer pattern 125 of the HV region but is not formed on the CELL region.

Meanwhile, like the embodiments described with reference to FIGS. 7 through 12, this embodiment can employ one material layer selected from the group consisting of a silicon oxide layer, a silicon nitride layer, a silicon oxynitride layer and a polysilicon layer, as the sacrificial layer pattern. Also, as described with reference to FIGS. 7C, 9C and 11C, this embodiment can allow the silicon oxide layer pattern to remain on the CELL region.

Further, another embodiment for forming a gate insulating layer may include sequentially forming an HV gate insulating layer pattern and an LV gate insulating layer pattern, and forming a cell gate insulating layer pattern on the CELL region. The forming of the cell gate insulating layer pattern includes removing the cell gate insulating layer of the HV and LV regions using a sacrificial layer pattern. The above-described embodiment applies correspondingly to a concrete method for this process, and thus a detailed description will be omitted.

According to the embodiments described herein, after the upper insulating layer 140 is formed, a thermal annealing may be performed in a temperature range of approximately 810° C. to approximately 1370° C. The properties of the floating trap type nonvolatile memory device can be improved by a thermal annealing performed in the aforementioned temperature range. For example, the thermal annealing performed in the given temperature range can decrease a thickness of an equivalent oxide layer of the upper insulating layer 140 to widen the threshold voltage window of a cell transistor. Also, it is known that the breakdown voltage of an insulating layer decreases when the thickness of the equivalent oxide layer decreases. However, the thermal annealing performed in the given temperature range does not accompany a decrease in the breakdown voltage but rather allows the breakdown voltage to be increased.

FIGS. 25 through 31 are graphs showing experimental results obtained from a thermal annealing in which the experiments are performed so as to confirm the aforementioned effect. In those experiments, a memory cell transistor having a cell gate insulating layer comprised of a silicon oxide layer, a silicon nitride layer and an aluminum oxide (e.g., $Al_2O_3$) layer was used.

At this time, the silicon oxide layer, the silicon nitride layer and the aluminum oxide layer were used as the lower insulating layer 120, the charge storage layer 130 and the upper insulating layer 140, respectively. Also, the silicon oxide layer and the silicon nitride layer were 35 Å and 70 Å thick, respectively. The thicknesses of the aluminum oxide layer were changed depending on objects of the experiments, and will be again mentioned in the descriptions for the respective experiments.

Figure 25:
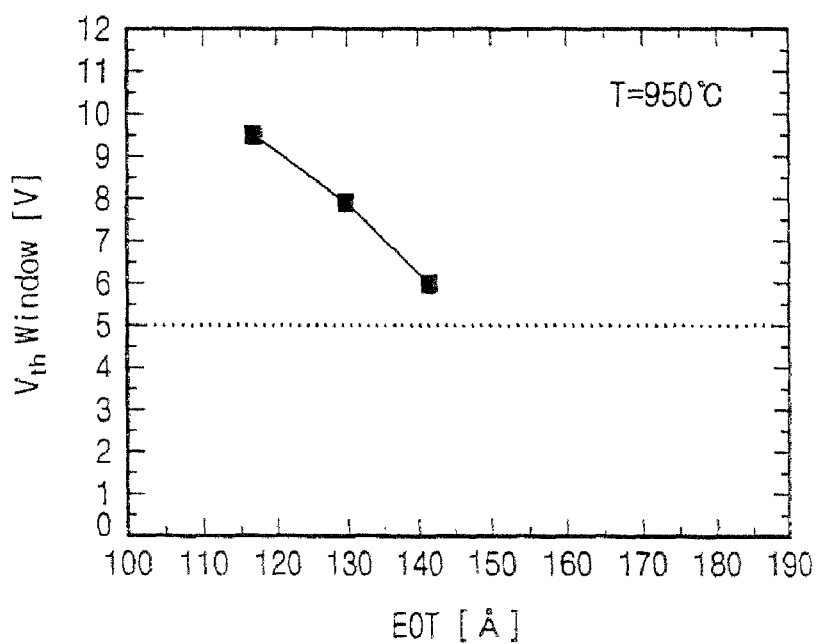
FIG. 25 is a graph measuring a relationship between an equivalent oxide thickness and a threshold voltage window of an upper insulating layer.

FIG. 25 is a graph measuring a relationship between an equivalent oxide thickness and a threshold voltage window of the upper insulating layer 140. The equivalent oxide thickness means the thickness of the silicon oxide layer that can obtain the same electrical effect as well known in this art. At this point, the equivalent oxide thickness is discriminated from a physical deposition thickness. Also, the threshold voltage window is one of many items for evaluating characteristics of the nonvolatile memory cell, and it means a difference in threshold voltage between a program state and an erase state of the nonvolatile memory cell. As well known, since the read operation of the nonvolatile memory cell reads the stored information using the difference in threshold voltage between the program state and the erase state of the nonvolatile memory cell, it is preferable that the threshold voltage window is large. Typically, for an effective read operation, at least 5 volts or more threshold voltage window is required.

The graph of FIG. 25 shows results of threshold voltage windows of respective cells as measured under the measurement conditions shown in the below Table 2 after the upper insulating layers 140 formed at different thicknesses are thermally annealed under the same condition. In the graph, the horizontal axis indicates the equivalent oxide thickness of the cell gate insulating layer (considering that the lower insulating layer 120 and the charge storage layer 130 formed with the same structure were used in the experiments, a variation of the equivalent oxide thickness corresponds to a variation of the equivalent oxide thickness of the upper insulating layer 140). The upper insulating layers 140 are all made of aluminum oxide, and the thermal annealing was performed at a temperature of 950° C. As shown in the graph, as the equivalent oxide thickness (EOT) of the upper insulating layer 140 increases, the threshold voltage window decreases substantially linearly.

TABLE 2

|  | Voltage | Time |
| --- | --- | --- |
| Program | 22 V | 200 μsec |
| Erase | −22 V | 2 msec |

Figure 26:
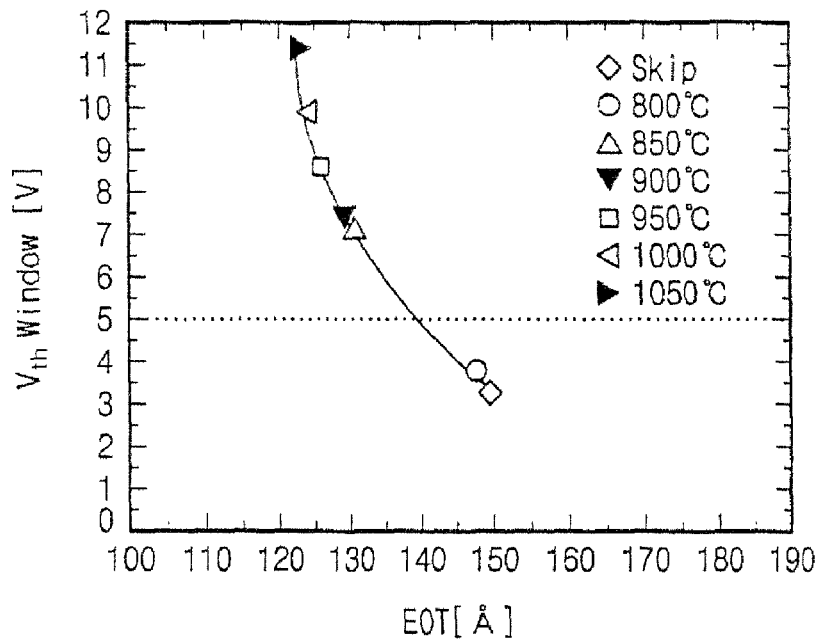
FIG. 26 is a graph showing experimental results to evaluate a relationship between a thermal annealing temperature and a threshold voltage window.

FIG. 26 is a graph showing experimental results to evaluate a relationship between a thermal annealing temperature and a threshold voltage window. In this experiment, aluminum oxides having a physical deposition thickness of 200 Å were used as the upper insulating layer 140. Also, the equivalent oxide thickness (EOT) and the threshold voltage window were measured while the thermal annealing temperature was varied. That is, the thermal annealings used in the measurement experiments were classified into non-thermal annealing, and thermal annealings at temperatures of 800° C., 850° C., 900° C., 950° C., 1,000° C. and 1,050° C. Other conditions were the same as those in the experiment of FIG. 25.

Referring to FIG. 26, as the process temperature for the thermal annealing was increased, the equivalent oxide thickness (EOT) was decreased and the size of the threshold voltage window was increased. In particular, as aforementioned, considering that the threshold voltage window is preferably more than 5 volts, it can be known that the cases of the non-thermal annealing and the thermal annealing at 800° C. do not satisfy the threshold voltage window characteristic. On the other hand, the case of the thermal annealings at 800° C. or more temperatures can obtain a threshold voltage window of more than 7 volts. In this point, it is preferable that the thermal annealings be performed at a temperature of more than approximately 810° C.

Additionally, compared with FIG. 25, a variation rate of the threshold voltage window depending on a variation in the temperature of the thermal annealings was larger than a variation rate in the threshold voltage window, which occurs from a variation in thickness of the equivalent oxide thickness. Considering this fact, it can be known that the thermal annealing method at a temperature of more than approximately 810° C. is more effective than the method of simply decreasing the deposition thickness of the upper insulating layer so as increase the threshold voltage window. In particular, decreasing the deposition thickness of the upper insulating layer 140 causes the breakdown voltage of the cell gate insulating layer 150 to be decreased, but the thermal annealing (which will be described with reference to FIG. 27) can extend the threshold voltage window without decreasing such a breakdown voltage.

Figure 27:
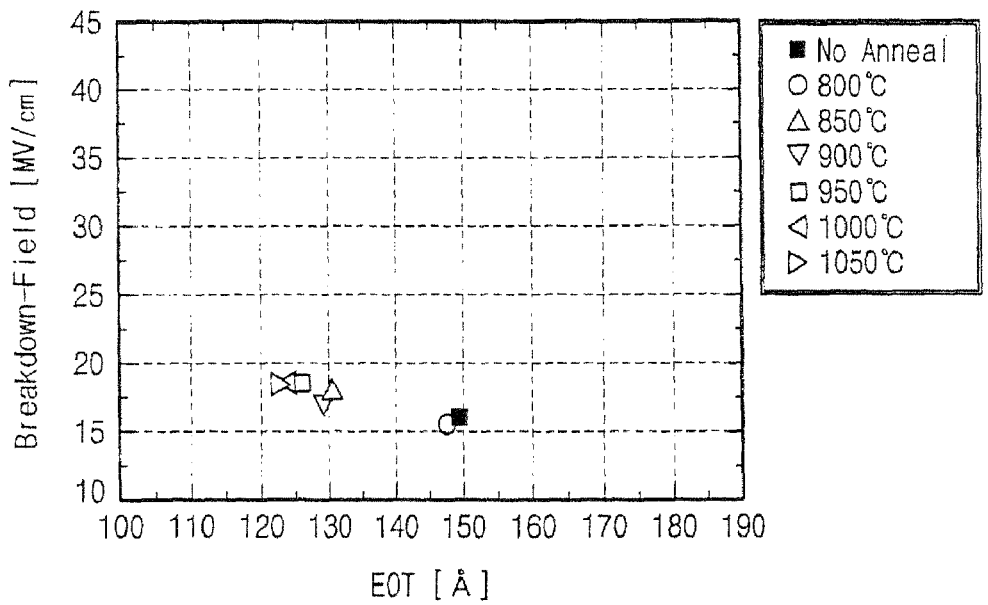
FIG. 27 is a graph showing experimental results to evaluate a relationship between a thermal annealing temperature and a breakdown voltage of a cell gate insulating layer.

FIG. 27 is a graph showing experimental results to evaluate a relationship between a thermal annealing temperature and a breakdown voltage of the cell gate insulating layer. In this experiment, the thermal annealings were performed at temperatures of 800° C., 850° C., 900° C., 950° C., 1,000° C. and 1,050° C., and cell gate insulating layers which are the same in the stacking sequence, material and deposition thickness were used. The measurement of the breakdown voltage was performed by measuring a current flowing through the cell gate insulating layer 150 while a difference of voltages applied to both ends of the cell gate insulating layer 150 is increased. The breakdown voltages shown in the graph represent voltages when the current flowing through the cell gate insulating layer 150 is 10 mA. Also, like the previous cases, for the comparison, the breakdown voltage was measured even with respect to the case where the thermal annealing was not performed.

Referring to FIG. 27, as aforementioned, though the equivalent oxide thickness of the upper insulating layer 140 was decreased with the thermal annealing temperature being increased, the measured breakdown voltage was not decreased with the thermal annealing temperature being increased. Rather, according to the experimental graph shown, the breakdown voltages of test samples thermally annealed at temperatures of 850° C., 900° C., 950° C., 1,000° C. and 1,050° C. were increased compared with a sample not thermally annealed and a sample thermally annealed at 800° C. As aforementioned, since it is forecasted that a decrease in the equivalent oxide thickness causes a decrease in the breakdown voltage, an increase in the breakdown voltage by the thermal annealings of more than 850° C. is a characteristic that is not generally forecasted. Also, in program and erase operations of the nonvolatile memory device, upon considering that a high voltage is not applied to the cell gate insulating layer 160, the increase in the breakdown voltage is an improved characteristic which makes it easy to fabricate the nonvolatile memory device and design a circuit thereof.

Meanwhile, to improve the program and erase characteristics, the retention characteristic and the endurance characteristic, the thermal annealing is preferably performed in a temperature range of approximately 1000° C. to approximately 1370° C.

Figure 28A:
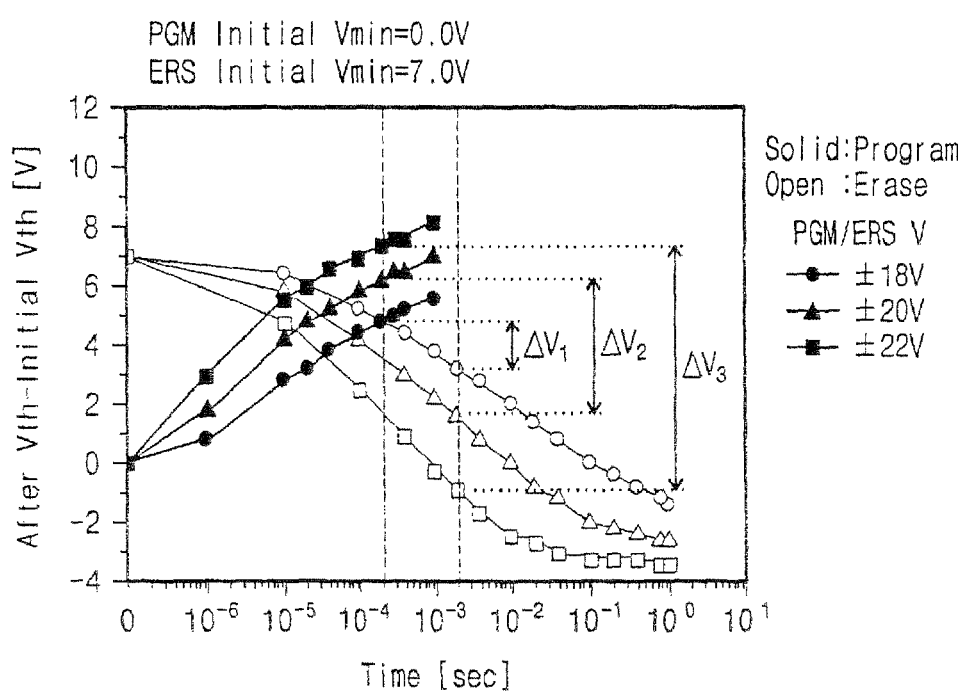
FIGS. 28A and 28B are graphs showing experimental results to evaluate a relationship between a thermal annealing temperature and the program and erase characteristics of a memory cell transistor.
Figure 28B:
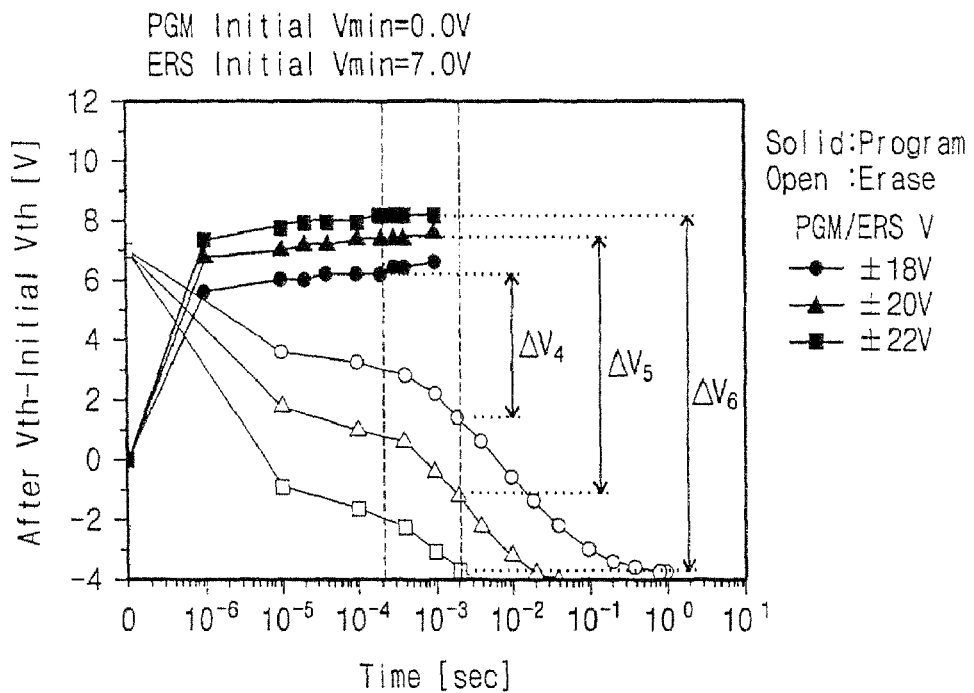

FIGS. 28A and 28B are graphs showing experimental results to evaluate a relationship between the thermal annealing temperature and the program and erase characteristics of the memory cell transistor. More concretely, FIGS. 28A and 28B show experimental results for test samples which underwent a rapid thermal annealing for 30 seconds at temperatures of 950° C. and 1,050° C. The cell gate insulating layers used in the respective experiments were the same in the stacking sequence, material and deposition thickness as those in the previously described experiments.

The program and erase characteristics shown in the graph show results of when, after the initial threshold voltage of the memory cell transistor was controlled to an erase state or a program state, a variation in the threshold voltage was measured with a variation in time and applied voltage. The initial threshold voltage of the erase state was 0 volt and the initial threshold voltage of the program state was 7 volts. Also, the applied voltage in the program operation was varied to 18 V, 20 V and 22 V, respectively, while the applied voltage in the erase operation was varied to −18 V, −20 V and −22 V, respectively.

Referring to FIG. 28A, when the applied voltages were ±18 V, ±20 V and ±22 V, respectively, the threshold voltage windows $\Delta V_1$, $\Delta V_2$ and $\Delta V_3$ were approximately 1.7 V, 4.7 V and 7 V, respectively. At this time, as aforementioned, the threshold voltage windows mean a difference between a threshold voltage measured in the program operation of 200 μsec and a threshold voltage measured in the erase operation of 2 msec. As aforementioned, considering that the threshold voltage window of more than at least 5 volts is required, the applied voltages, ±18 V and ±20 V, are not effective as the operating voltage of the memory cell transistor which is thermally annealed at a temperature of 950° C. In other words, only the applied voltage of ±22 V is suitable for the operating voltage of the memory cell transistor which is thermally annealed at a temperature of 950° C.

In contrast with this, referring to FIG. 28B, when the applied voltages were ±18 V, ±20 V and ±22 V, respectively, the threshold voltage windows $\Delta V_4$, $\Delta V_5$ and $\Delta V_6$ were approximately 4.9 V, 8.5 V and 11.6 V, respectively. Therefore, when a voltage larger than ±18 V is applied, it is suitable for the operating voltage of the memory cell transistor which is thermally annealed at a temperature of 1050° C.

From these experiment results, it can be understood that when the thermal annealing temperature increases, it is possible to decrease the voltage applied for the program and erase operations. For example, as shown in FIG. 28B, the memory cell transistor which was thermally annealed at 1050° C. can effectively operate at the applied voltage of ±20 V. Considering the above program and erase characteristics, it is more preferable that the thermal annealing be performed at a temperature of more than approximately 1000° C. However, at ±22 V which corresponds to a typical application voltage condition of the floating trap type nonvolatile memory device, sufficient program and erase characteristics can be obtained by only a thermal annealing at 850° C. as shown in FIG. 25.

Figure 29A:
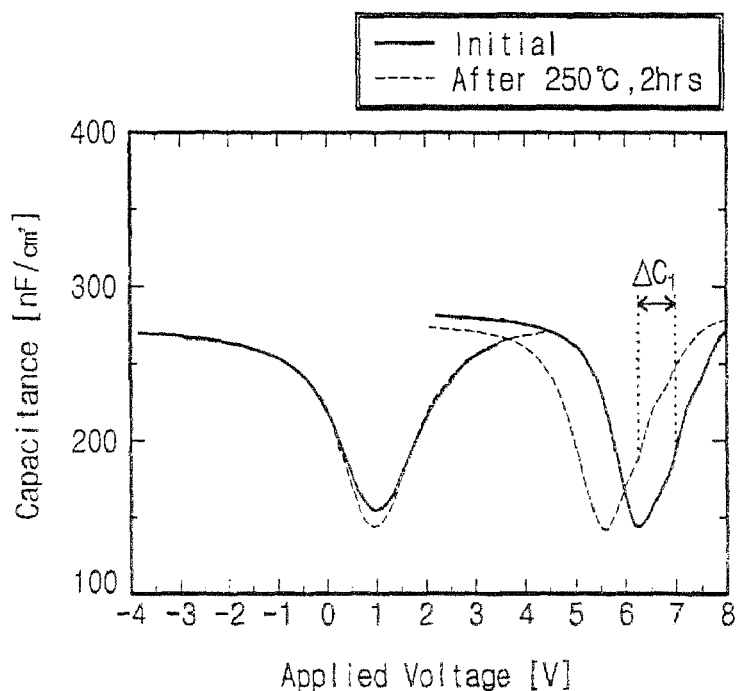
FIGS. 29A and 29B are graphs showing experimental results to evaluate the relationship between a thermal annealing temperature and the retention characteristic of a memory cell transistor.
Figure 29B:
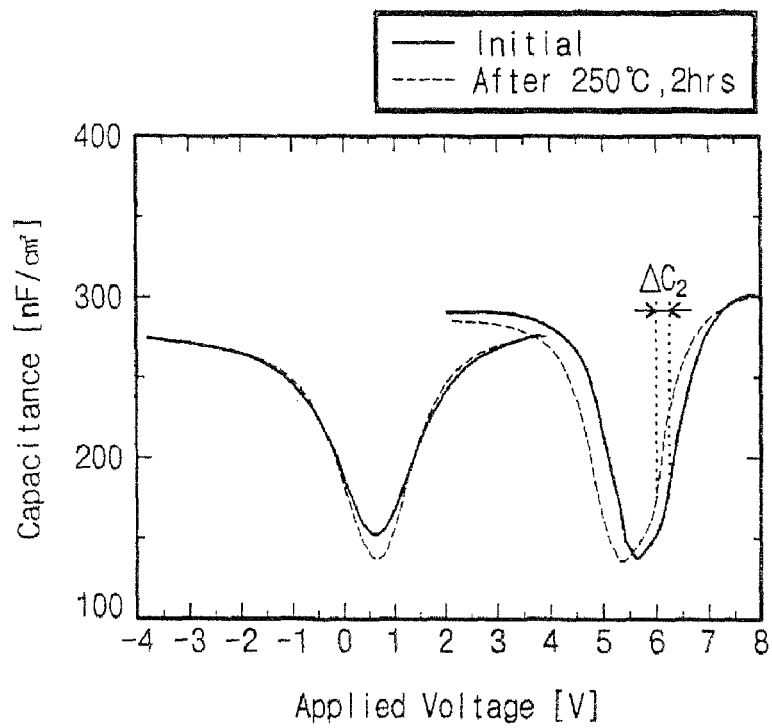

FIGS. 29A and 29B are graphs showing experiment results to evaluate the relationship between the thermal annealing temperature and the retention characteristic of a memory cell transistor. More specifically, FIGS. 29A and 29B show experiment results for test samples which underwent a rapid thermal annealing for 30 seconds at temperatures of 950° C. and 1050° C., respectively, in which the cell gate insulating layers used in the respective experiments were the same in the stacking sequence, material and deposition thickness as those in the previous experiments.

The retention characteristic is one of many evaluation items of product reliability and it represents an ability of the charge storage layer 130 in the memory cell transistor to retain charges (or data) trapped therein. To measure the retention characteristic, the test samples were heated for two hours at 250° C. and then a static capacitance-voltage (CV) of the cell gate insulating layer was measured. As well known, since the static capacitance of the cell gate insulating layer is a parameter influencing the threshold voltage of the transistor, a movement of the CV curve means a variation of the threshold voltage window.

Referring to FIGS. 29A and 29B, a variation ($\Delta C1$ of FIG. 29A) in the CV curve of a test sample thermally annealed at 950° C. was larger than a variation ($\Delta C2$ of FIG. 29B) in the CV curve of a test sample thermally annealed. Variations of the threshold voltage calculated from the movement of the measured CV curve were 0.6 volts at 950° C. and 0.5 volts at 1050° C., respectively. Resultantly, it can be understood that the thermal annealing at 1050° C. improves the retention characteristic of the memory cell transistor, compared with the thermal annealing at 950° C.

Figure 30A:
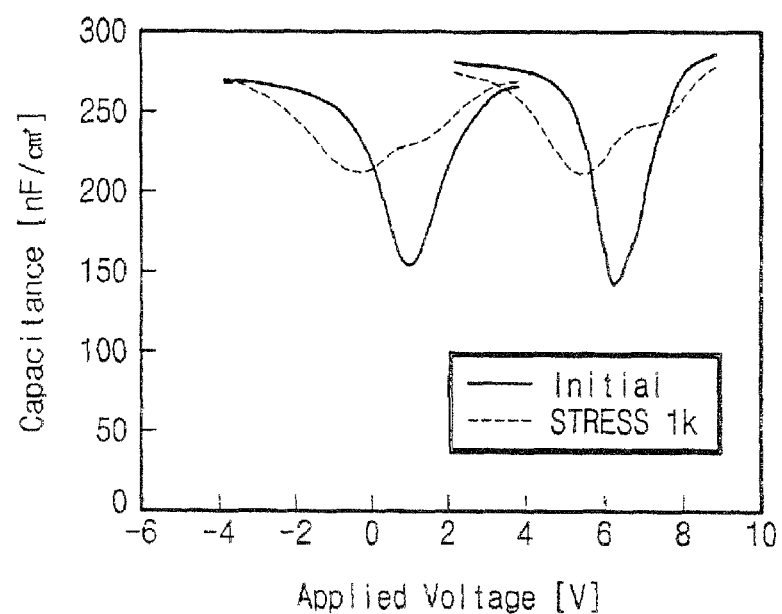
FIGS. 30A and 30B are graphs showing experimental results to evaluate the relationship between a thermal annealing temperature and an endurance characteristic.
Figure 30B:
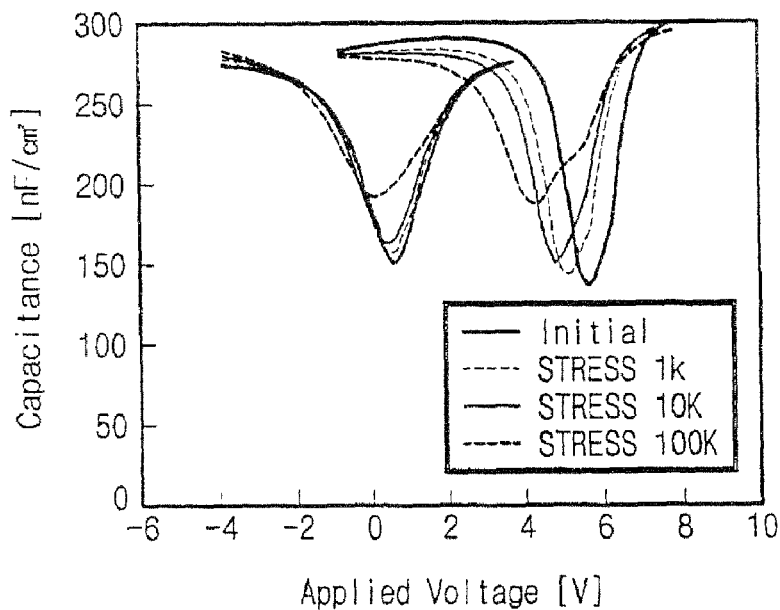

FIGS. 30A and 30B are graphs showing experimental results to evaluate the relationship between the thermal annealing temperature and the endurance characteristic. More specifically, FIGS. 30A and 30B show experimental results for test samples which underwent a rapid thermal annealing for 30 seconds at temperatures of 950° C. and 1050° C., respectively, in which the cell gate insulating layers used in the respective experiments were the same in the stacking sequence, material and deposition thickness as those in the previous experiments.

The endurance characteristic is one of the evaluation items on the product reliability and it represents a degradation characteristic of the memory cell transistor due to the repeated program and erase operations. To evaluate the endurance characteristic, a write operation having one period consisting of a program and an erase was repeatedly performed, and then a static capacitance-voltage (CV) of the cell gate insulating layer 150 was measured. Likewise in this case, it can be understood that as a variation in the CV curve increases, a degradation in the endurance characteristic deepened. Meanwhile, as described in relation to FIGS. 28A and 28B, the effective minimum application voltages of the memory cell transistors thermally annealed at 950° C. and 1050° C., respectively were ±20 V and ±18 V. Considering the above fact, the application voltage of ±20 V was repeatedly applied to the memory cell transistor thermally annealed at 950° C., and the application voltage of ±18 V was repeatedly applied to the memory cell transistor thermally annealed at 1050° C.

Referring to FIGS. 30A and 30B, the CV curve measured with the test sample thermally annealed at 950° C. was seriously deformed after 1000 write operations were repeated, compared with an initial state, and it was degraded into a non-measurable state after 10,000 write operations were repeated. On the other hand, while the CV curve measured with the test sample thermally annealed at 1050° C. was slightly deformed but was kept in a stable state until 100,000 write operations were repeated. From those experiment results, it can be understood that the thermal annealing at 1050° C. improves the endurance characteristic of the memory cell transistor, compared with the thermal annealing at 950° C.

Figure 31:
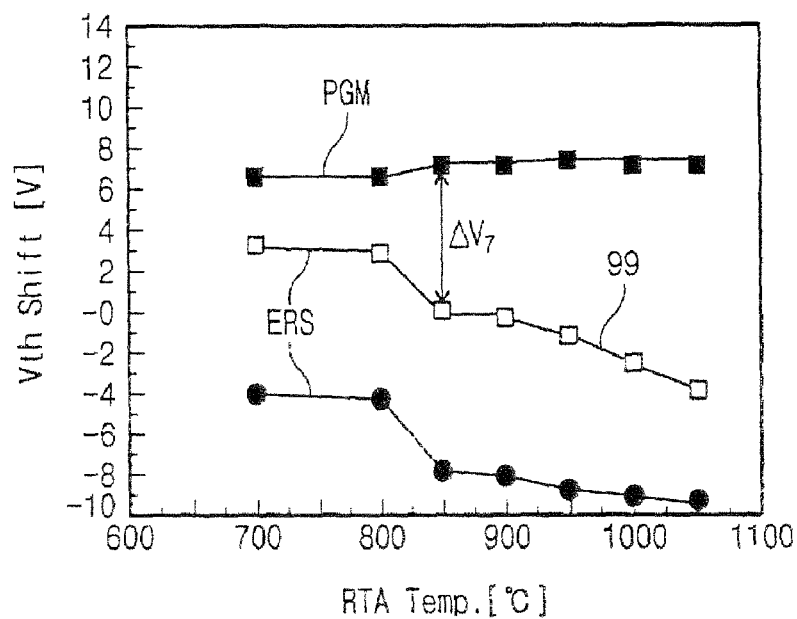
FIG. 31 is a graph showing experimental results to evaluate the influence of a thermal annealing on the erase characteristic.

FIG. 31 is a graph showing experimental results to evaluate the influence of thermal annealing on the erase characteristic. Test samples used in this experiment were the same as those in the previous experiments, except for the thermal annealing temperature.

Referring to FIG. 31, the erase voltage of a test sample thermally annealed at a temperature of more than 850° C. was considerably lowered, compared with test samples thermally annealed at 800° C. and test samples which did not undergo the thermal annealing. In particular, the thermal annealing at a temperature of more than 850° C. results in the threshold voltage of the test samples having a high initial threshold voltage in the erase state being effectively lowered. For instance, due to the thermal annealing at 850° C., the threshold voltage window ΔV7 was increased to approximately 7 volts. From this fact, as aforementioned, it is preferable that the thermal annealing be performed at a temperature of more than approximately 850° C.

Meanwhile, according to embodiments described herein, the silicon oxide layer used as the lower insulating layer 120 may be approximately 20 Å to approximately 80 Å thick, the silicon nitride layer used as the charge storage layer 130 may be approximately 40 Å to approximately 120 Å thick. Also, the aluminum oxide layer used as the upper insulating layer 140 may be approximately 100 Å to approximately 300 Å thick. The aluminum oxide layer can be formed by one selected from the group consisting of a physical vapor deposition, an atomic layer deposition and a plasma-enhanced atomic layer deposition.

Also, the thermal annealing according to the embodiments described herein is preferably performed for approximately 0.1 seconds to approximately 5 hours in an ambient including a nitrogen ($N_2$) gas, an oxygen ($O_2$) gas and an ammonia ($NH_3$) gas. At this time, the process time for the thermal annealing can be changed depending on the heating method. For example, the thermal annealing can include a gradual temperature rising step, a high temperature maintenance step and a gradual temperature drop step after substrates each having the upper insulating layer 140 formed thereon are loaded into an inside of a furnace. In this case, the thermal annealing time can be a few minutes or a few hours. Also, the thermal annealing can be performed for approximately 0.1 seconds to approximately 10 minutes by a rapid thermal annealing.

According to a modified embodiment, the thermal annealing may be performed after gate electrodes are formed on the cell gate insulating layer 150 and impurity regions are formed in the semiconductor substrate 100 around the gate electrodes. At this time, the gate electrodes are preferably formed of at least one selected from the group consisting of tantalum nitride (TaN), titanium nitride (TiN), tungsten (W), tungsten nitride (WN), hafnium nitride (HfN) and tungsten silicide ($WSi_x$). Also, the impurity regions can be formed by an ion implantation technique using the gate electrodes as an ion mask. According to this embodiment, the thermal annealing can activate the impurity ions implanted into the impurity regions. Meanwhile, considering that the thermal annealing for the activation of the impurity ions is generally performed at a temperature of less than 850° C., it is discriminated from the thermal annealing.

According to another modified embodiment, a plasma processing for improving the physical property of the upper insulating layer may be further performed before or after the thermal annealing is performed. The plasma processing is preferably performed using a process gas including at least one among an oxygen ($O_2$) gas, an ozone ($O_3$) gas and a dinitrogen monoxide ($N_2O$) gas.

Figure 32:
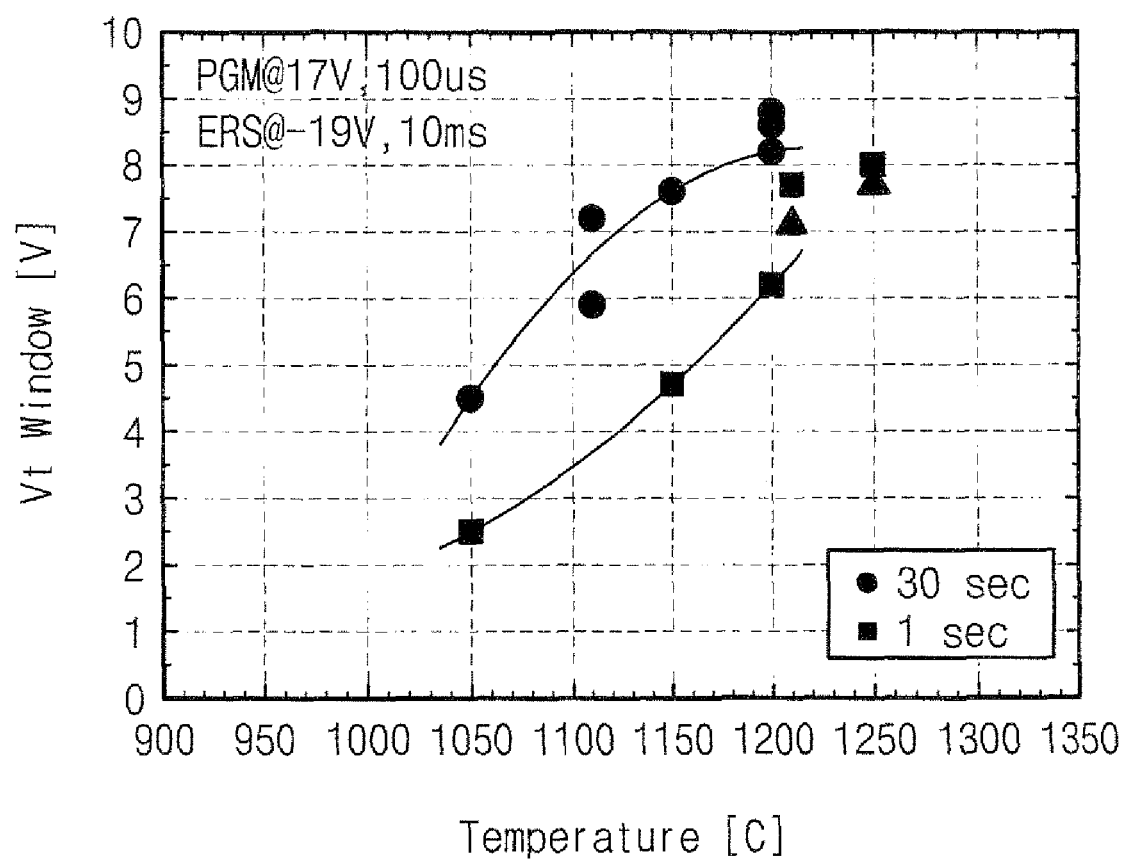
FIG. 32 is a graph showing a result of another experiment for evaluating an effect of thermal treatment on the threshold voltage window.

FIG. 32 is a graph showing a result of another experiment for evaluating an effect of thermal treatment on the threshold voltage window. In particular, this experiment is performed to evaluate how a property of threshold voltage window is affected by temperature and time of the thermal treatment. The thermal treatment is performed at a temperature range 1050° C. to 1250° C., in times of 1 sec and 30 sec. With regard to the measurement of threshold voltage window, a program operation is performed under the program condition of 100 usec and 17 Volt, and an erase operation is performed under the erase condition of 10 msec and 19V.

Referring to FIG. 32, the threshold voltage window was a sufficiently high value even in the high temperature range (i.e., over 1050° C.), which was not included in the temperature condition of the preceding experiment, and had a higher value than that of the preceding experiment. That is, the threshold voltage window was 8 volt and over in the case of the thermal treatment, which are performed under the temperature of 1200° C. and the time of 30 sec, and it was 6 volt and over in the case of other thermal treatment under the temperature of 1200° C. and the time of 1 sec. In this sense, if the temperature of thermal treatment is sufficiently high, it is estimated that an effective result (i.e., sufficiently high threshold voltage window) can be also obtained from the case of less process time (e.g., 0.1 sec). In addition, as shown in the graph, as the temperature of the thermal treatment is increased, the threshold voltage window also increases. Hence, it is estimated that a thermal treatment under a higher temperature can be also used to obtain an effective threshold voltage window. In practice, an upper limit of the thermal treatment temperature depends upon environmental restrictions such as a temperature in which a thermal damage of process chamber occur as opposed to physical properties of the sample. For example, the upper limit of the thermal treatment temperature may be the melting point of iron, 1539° C. The upper limit of the thermal treatment temperature may also be about 1370° C., but it is obvious that this upper limit may be changed (e.g., increased) when the aforementioned practical difficulties can be overcome.

According to embodiments described herein, a sacrificial layer pattern is formed on a cell gate insulating layer comprised of a lower insulating layer, a charge storage layer and an upper insulating layer sequentially stacked, the sacrificial layer pattern having an etch selectivity to the upper insulating layer. The sacrificial layer pattern prevents the upper insulating layer from contacting a photoresist pattern, so that problems that the upper insulating layer is damaged or its thickness is sharply varied is minimized.

Also, by using the etch selectivity between the upper insulating layer and the sacrificial layer pattern, it is possible to prevent the upper insulating layer from being damaged and to expose the semiconductor substrate of the peripheral region. Accordingly, the gate insulating layers having three different thicknesses, i.e., cell gate insulating layer pattern, high voltage gate insulating layer pattern and low voltage gate insulating layer pattern can be formed with stable characteristics.

According to embodiments described herein, a step of thermally annealing a resultant substrate having the upper insulating layer formed thereon at a temperature of approximately 810° C. to approximately 1370° C. is included. The thermal annealing performed at this temperature can improve the threshold voltage window of a floating trap type memory device, the breakdown voltage of a cell gate insulating layer, the retention characteristic and the endurance characteristic.

It will be apparent to those skilled in the art that various modifications and variations of the embodiments described herein can be made. Thus, it is intended that the present invention covers the modifications and variations of the embodiments described herein provided they come within the scope of the appended claims and their equivalents.

What is claimed is:

1. A method of fabricating a semiconductor device, the method comprising:
forming a cell gate insulating layer on a semiconductor substrate, the cell gate insulating layer including a lower insulating layer, a charge storage layer and an upper insulating layer, which are sequentially stacked;
thermally annealing the cell gate insulating layer at a temperature of 900° C. to 1370° C. using a rapid thermal annealing technique for about 0.1 seconds to about 20 minutes; and
forming a gate electrode on the thermally annealed cell gate insulating layer,
wherein the lower insulating layer, the charge storage layer and the upper insulating layer are formed of a silicon oxide, a silicon nitride and an aluminum oxide, respectively.

2. The method of claim 1, wherein a thickness of the aluminum oxide is about 100 Å to about 300 Å.

3. The method of claim 1, wherein forming the upper insulating layer is performed by one selected from the group consisting of physical vapor deposition, atomic layer deposition and plasma-enhanced atomic layer deposition.

4. The method of claim 1, wherein the thermal annealing is performed in a temperature range of greater than 1000° C. to about 1370° C.

5. The method of claim 1, wherein the thermal annealing is performed in an ambient including a nitrogen ($N_2$) gas, an oxygen ($O_2$) gas and an ammonia ($NH_3$) gas.

6. The method of claim 1, wherein the thermal annealing is performed using a rapid thermal annealing technique for about 0.1 seconds to about 10 minutes.

7. The method of claim 6, wherein the rapid thermal annealing technique is performed in a temperature range of about 1000° C. to about 1250° C.

8. The method of claim 1, wherein a thickness of the lower insulating layer is about 20 Å to about 80 Å, and a thickness of the charge storage layer is about 40 Å to about 120 Å.

9. The method of claim 1, wherein the gate electrode comprises at least one material selected from the group consisting of TaN, TiN, W, WN, HfN and $WSi_x$.

10. The method of claim 1, prior to or after performing the thermal annealing, performing a plasma treatment.

11. The method of claim 10, wherein the plasma treatment is performed using one selected from the group consisting of an oxygen ($O_2$) gas, an ozone ($O_3$) gas and a dinitrogen monoxide ($N_2O$) gas.

12. The method of claim 1, wherein the thermal annealing is performed at a temperature sufficient to crystallize the upper insulating layer.

13. A method of fabricating a semiconductor device on a semiconductor substrate with a peripheral circuit region composed of a high voltage transistor region and a low voltage transistor region and with a cell array region, the method comprising:
forming a cell gate insulating layer at least on the cell array region of the semiconductor substrate, the cell gate insulating layer being comprised of a lower insulating layer, a charge storage layer and an upper insulating layer sequentially stacked;
forming a sacrificial layer on the cell gate insulating layer, the sacrificial layer composed of at least one material having an etch selectivity with respect to the upper insulating layer;
forming a photoresist pattern exposing the sacrificial layer in the peripheral circuit region;
etching the exposed sacrificial region by using the photoresist pattern as an etch mask to form a sacrificial pattern covering the cell gate insulating layer in the cell array region; and
etching the cell gate insulating layer in the peripheral circuit region using the sacrificial pattern as a sacrificial etch mask,
wherein the method further comprises
thermally annealing a resultant substrate including the cell gate insulating layer at a temperature of about 750 to about 1100° C. using a rapid thermal annealing technique, after forming the cell gate insulating layer,
wherein the lower insulating layer, the charge storage layer and the upper insulating layer are formed of a silicon oxide, a silicon nitride and a high K dielectric, respectively and wherein the high-k dielectric is selected from a group consisting of aluminum oxide, hafnium oxide, hafnium aluminum oxide, and hafnium silicon oxide.

14. The method of claim 13, wherein a thickness of the aluminum oxide is about 100 Å to about 300 Å.

15. The method of claim 13, wherein the forming the upper insulating layer of an aluminum oxide is performed by one selected from the group consisting of a physical vapor deposition, an atomic layer deposition and a plasma-enhanced atomic layer deposition.

16. The method of claim 13, wherein the thermal annealing is performed in an ambient including a nitrogen ($N_2$) gas, an oxygen ($O_2$) gas and an ammonia ($NH_3$) gas.

17. The method of claim 13, wherein the thermal annealing is performed using a rapid thermal annealing technique for about 0.1 seconds to about 10 minutes.

18. The method of claim 13, wherein a thickness of the lower insulating layer is about 20 Å to about 80 Å, and a thickness of the charge storage layer is about 40 Å to about 120 Å.

19. The method of claim 13, wherein the gate electrode is formed of at least one material selected from the group consisting of TaN, TiN, W, WN, HfN and $WSi_x$.

20. The method of claim 13, prior to or after performing the thermal annealing, performing a plasma treatment.

21. The method of claim 20, wherein the plasma treatment is performed using one selected from the group consisting of an oxygen ($O_2$) gas, an ozone ($O_3$) gas and a dinitrogen monoxide ($N_2O$) gas.

22. The method of claim 13, wherein the thermal annealing is performed at a temperature sufficient to crystallize the upper insulating layer.

23. The method as claimed in claim 13, wherein the sacrificial pattern is composed of at least one material selected from the group consisting of a silicon oxide layer, a silicon nitride layer, a silicon oxynitride layer, and a polysilicon layer.

24. The method as claimed in claim 13, wherein the cell gate insulating layer in the peripheral circuit region is etched while the sacrificial layer is etched.

25. The method as claimed in claim 13, wherein the sacrificial pattern is made of a silicon oxide layer.

26. The method as claimed in claim 25, wherein etching the cell gate insulating layer comprises:
successively etching the upper insulating layer and the charge storage layer using the sacrificial pattern as an etch mask until the lower insulating layer is exposed; and
etching the sacrificial pattern and the lower insulating layer.

27. The method as claimed in claim 13, wherein the sacrificial pattern is made of a silicon nitride layer.

28. The method as claimed in claim 27, wherein etching the cell gate insulating layer in the peripheral circuit region comprises:
exposing the charge storage layer by etching the upper insulating layer using the sacrificial pattern as an etch mask;
exposing the upper insulating layer in the cell array region and the lower insulating layer in the peripheral circuit region by etching the sacrificial pattern and the charge storage layer; and
etching the lower insulating layer by using an etch recipe having an etch selectivity with respect to the exposed upper insulating layer.

29. The method as claimed in claim 13, wherein the sacrificial pattern is composed of a silicon oxide layer and a silicon nitride layer that are sequentially stacked.

30. The method as claimed in claim 29, wherein etching the cell gate insulating layer in the peripheral circuit region comprises:
exposing the charge storage layer in the peripheral circuit region by etching the upper insulating layer using the sacrificial pattern as an etch mask;
exposing the silicon oxide layer in the cell array region and the lower insulating layer in the peripheral circuit region by etching the silicon nitride layer and the charge storage layer; and
etching the silicon oxide layer and the lower insulating layer.

31. The method as claimed in claim 13, wherein the sacrificial pattern is composed of a silicon nitride layer and a silicon oxide layer that are sequentially stacked.

32. The method as claimed in claim 31, wherein etching the cell gate insulating layer in the peripheral circuit region comprises:
exposing the silicon nitride layer in the cell array region and the charge storage layer in the peripheral circuit region by etching the silicon oxide layer and the upper insulating layer;
exposing the upper insulating layer in the cell array region and the lower insulating layer in the peripheral circuit region by etching the silicon nitride layer and the charge storage layer; and
removing the lower insulating layer by using an etch recipe having an etch selectivity with respect to the upper insulating layer.

33. The method as claimed in claim 13, wherein the sacrificial pattern is composed of a lower silicon oxide layer, a silicon nitride layer, and an upper silicon oxide layer that are sequentially stacked.

34. The method as claimed in claim 33, wherein etching the cell gate insulating layer in the peripheral circuit region comprises:
exposing the silicon nitride layer in the cell array region and the charge storage layer in the peripheral circuit region by etching the upper silicon oxide layer and the upper insulating layer;
exposing the lower silicon oxide layer in the cell array region and the lower insulating layer in the peripheral circuit region by etching the silicon nitride layer and the charge storage layer; and
etching the lower silicon oxide layer and the lower insulating layer.

* * * * *